(12) United States Patent
Cunningham et al.

(10) Patent No.: US 6,876,047 B2
(45) Date of Patent: Apr. 5, 2005

(54) MEMS DEVICE HAVING A TRILAYERED BEAM AND RELATED METHODS

(75) Inventors: Shawn Jay Cunningham, Colorado Springs, CO (US); Dana Richard DeReus, Colorado Springs, CO (US); Subham Sett, Colorado Springs, CO (US); Svetlana Tatic-Lucic, Bethlehem, PA (US)

(73) Assignees: Turnstone Systems, Inc., Santa Clara, CA (US); Wispry, Inc., Cary, NC (US)

( * ) Notice: Subject to any disclaimer, the term of this patent is extended or adjusted under 35 U.S.C. 154(b) by 11 days.

(21) Appl. No.: 10/290,779

(22) Filed: Nov. 8, 2002

(65) Prior Publication Data

US 2003/0116848 A1 Jun. 26, 2003

Related U.S. Application Data

(60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338,055, filed on Nov. 9, 2001, provisional application No. 60/338,069, filed on Nov. 9, 2001, and provisional application No. 60/338,072, filed on Nov. 9, 2001.

(51) Int. Cl.$^7$ .............................................. H01L 29/84
(52) U.S. Cl. ...................................... 257/415; 200/512
(58) Field of Search ........................... 257/415; 438/52; 200/181, 512; 335/203

(56) References Cited

U.S. PATENT DOCUMENTS

| | | | |
|---|---|---|---|
| 5,578,976 A | * 11/1996 | Yao | 333/262 |
| 5,638,946 A | 6/1997 | Zavracky | 200/181 |
| 6,046,659 A | 4/2000 | Loo et al. | 333/262 |
| 6,057,520 A | 5/2000 | Goodwin-Johansson | 200/181 |
| 6,175,170 B1 | * 1/2001 | Kota et al. | 310/40 MM |
| 6,232,847 B1 | * 5/2001 | Marcy et al. | 331/167 |
| 6,535,318 B1 | * 3/2003 | Wood et al. | 359/224 |
| 2002/0050881 A1 | * 5/2002 | Hyman et al. | 335/78 |

OTHER PUBLICATIONS

"Bottom Contact Micromechanical Switching Geometry," IBM Technical Disclosure Bulletin, vol. 21, No. 3, pp. 1207–1208, Aug. 1978.*

* cited by examiner

*Primary Examiner*—Stephen W. Smoot
(74) *Attorney, Agent, or Firm*—Pillsbury Winthrop LLP

(57) ABSTRACT

MEMS Device Having A Trilayered Beam And Related Methods. According to one embodiment, a movable, trilayered microcomponent suspended over a substrate is provided and includes a first electrically conductive layer patterned to define a movable electrode. The first metal layer is separated from the substrate by a gap. The microcomponent further includes a dielectric layer formed on the first metal layer and having an end fixed with respect to the substrate. Furthermore, the microcomponent includes a second electrically conductive layer formed on the dielectric layer and patterned to define an electrode interconnect for electrically communicating with the movable electrode.

22 Claims, 18 Drawing Sheets

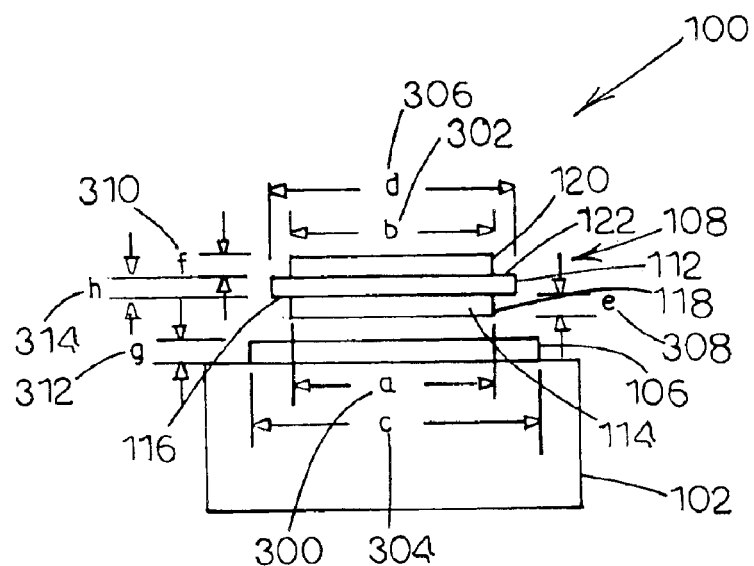
Fig·3
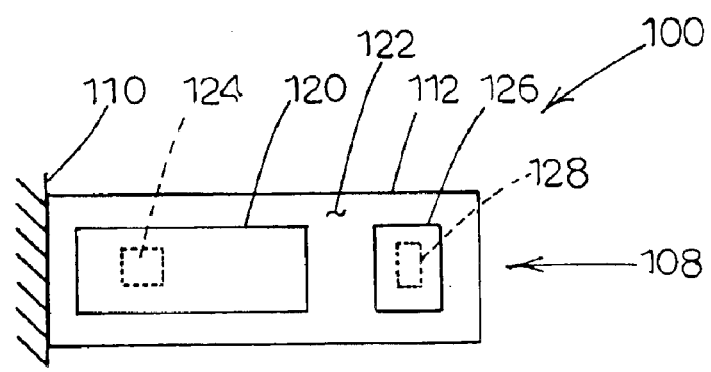
Fig·4

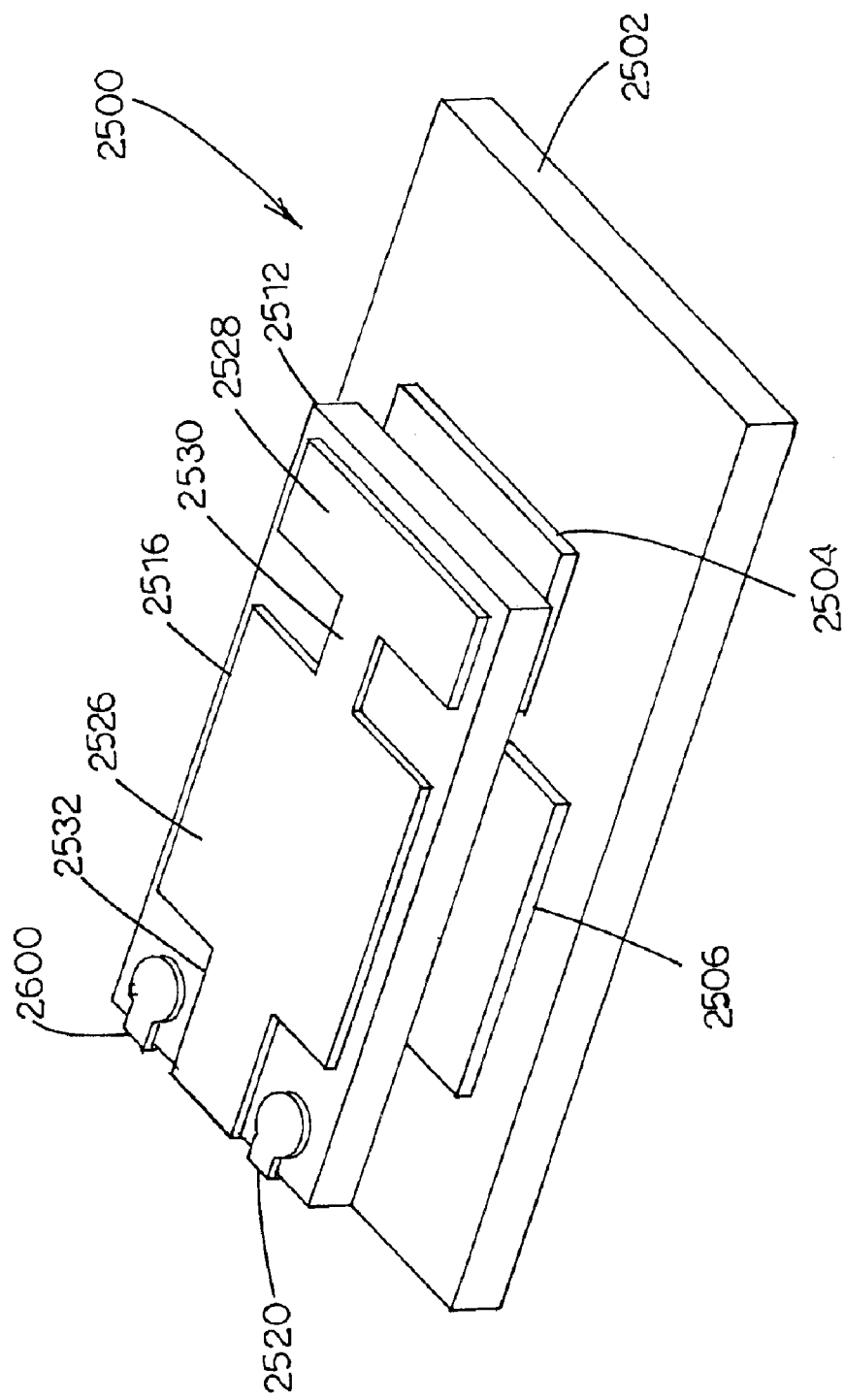

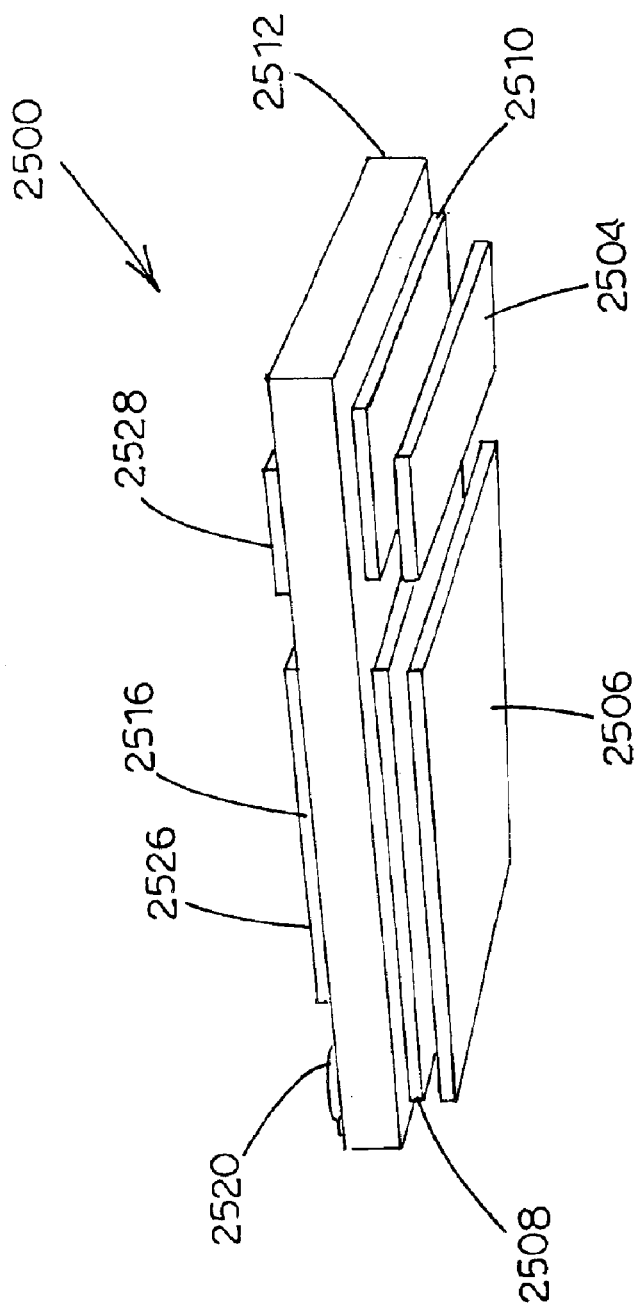

MEMS DEVICE HAVING A TRILAYERED BEAM AND RELATED METHODS

CROSS-REFERENCE TO RELATED APPLICATIONS

This nonprovisional application claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisional Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following are all incorporated by reference herein in their entirety: U.S. patent application Ser. No. 10/290,779 filed Nov. 8, 2002; U.S. patent application Ser. No. 10/290,920 filed Nov. 8, 2002, now U.S. Pat. No. 6,746,891; U.S. patent application Ser. No. 10/291,125 filed Nov. 8, 2002, now U.S. Publication No. 2004/0012298; and U.S. patent application Ser. No. 10/290,807 filed Nov. 8, 2002, now U.S. Publication No. 2003/0117257.

TECHNICAL FIELD

The present invention generally relates to micro-electromechanical systems (MEMS) devices. More particularly, the present invention relates to the design of a MEMS device having a trilayered beam and related methods.

BACKGROUND ART

An electrostatic MEMS switch is a switch operated by an electrostatic charge and manufactured using micro-electromechanical systems (MEMS) techniques. A MEMS switch can control electrical, mechanical, or optical signal flow. MEMS switches have application to telecommunications, such as DSL switch matrices and cell phones, Automated Testing Equipment (ATE), and other systems that require low cost switches or low-cost, high-density arrays.

As appreciated by persons skilled in the art, many types of MEMS switches and related devices can be fabricated by either bulk or surface micromachining techniques. Bulk micromachining generally involves sculpting one or more sides of a substrate to form desired three-dimensional structures and devices in the same substrate material. The substrate is composed of a material that is readily available in bulk form, and thus ordinarily is silicon or glass. Wet and/or dry etching techniques are employed in association with etch masks and etch stops to form the microstructures. Etching is typically performed on the frontside or backside of the substrate. The etching technique can generally be either isotropic or anisotropic in nature. Isotropic etching is insensitive to the crystal orientation of the planes of the material being etched (e.g., the etching of silicon by using a nitric acid as the etchant). Anisotropic etchants, such as potassium hydroxide (KOH), tetramethyl ammonium hydroxide (TMAH), and ethylenediamine pyrochatechol (EDP), selectively attack different crystallographic orientations at different rates, and thus can be used to define relatively accurate sidewalls in the etch pits being created. Etch masks and etch stops are used to prevent predetermined regions of the substrate from being etched.

On the other hand, surface micromachining generally involves forming three-dimensional structures by depositing a number of different thin films on the top of a silicon wafer, but without sculpting the wafer itself. The films usually serve as either structural or sacrificial layers. Structural layers are frequently composed of polysilicon, silicon nitride, silicon dioxide, silicon carbide, or aluminum. Sacrificial layers are frequently composed of polysilicon, photoresist material, polyimide, metals or various kinds of oxides, such as PSG (phosphosilicate glass) and LTO (low-temperature oxide). Successive deposition, etching, and patterning procedures are carried out to arrive at the desired microstructure. In a typical surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure is ordinarily anchored to the silicon substrate, and can be designed to be movable in response to an input from an appropriate actuating mechanism.

Many current MEMS switch designs employ a cantilievered beam (or plate), or multiply-supported beam geometry for the switching structure. In the case of cantilevered beams, these MEMS switches include a movable, bimaterial beam comprising a structural layer of dielectric material and a layer of metal. Typically, the dielectric material is fixed at one end with respect to the substrate and provides structural support for the beam. The layer of metal is attached on the underside of the dielectric material and forms a movable electrode and a movable contact. The layer of metal can form part of the anchor. The movable beam is actuated in a direction toward the substrate by the application of a voltage difference across the electrode and another electrode attached to the surface of the substrate. The application of the voltage difference to the two electrodes creates an electrostatic field, which pulls the beam towards the substrate. The beam and substrate each have a contact which is separated by an air gap when no voltage is applied, wherein the switch is in the "open" position. When the voltage difference is applied, the beam is pulled to the substrate and the contacts make an electrical connection, wherein the switch is in the "closed" position.

One of the problems that faces current MEMS switches having a bimaterial beam is curling or other forms of static displacement or deformation of the beam. The static deformation can be caused by a stress mismatch or a stress gradient within the films. At some equilibrium temperature, the mismatch effects could be balanced to achieve a flat bimaterial structure but this does not fix the temperature dependent effects. The mismatch could be balanced through specific processes (i.e., deposition rates, pressures, method, etc.), through material selection, and through geometrical parameters such as thickness. This bimaterial structure of metal and dielectric introduces a large variation in function over temperature, because the metal will typically have a higher thermal expansion rate than the dielectric. Because of the different states of static stress in the two materials, the switch can be deformed with a high degree of variability. Oftentimes, switch failure results because of the deformation of the beam. Switch failure results when electrical contact is not established between the movable and stationary contacts due to static deformation or because of the deformation introduced as a function of temperature. A second mode of failure is observed when the movable contact and the stationary contact are prematurely closed, resulting in a "short". Because of the deformation of the beam, the actuation voltage is increased or decreased depending on whether it is curved away from the substrate or towards the substrate, respectively. Because of this variability, the available voltage may not be adequate to achieve the desired contact force and, thus, contact resistance.

Some current MEMS switch designs having the bimaterial beam attach the metal layer for the movable electrode to the topside of the dielectric material. The metal layer for the moving contact must still be on the underside of the dielectric material. This design serves to provide isolation between the movable electrode and the stationary substrate electrode; however, this design requires a higher voltage for actuation because the gap distance between the metal layer and the electrode attached to the surface of the substrate is greater. The effective gap is now the sum of the gap between the stationary electrode and the dielectric and the dielectric thickness. Thus, such a design requires greater power consumption and creates problems with regard to dielectric charging.

Therefore, it is desirable to provide a beam for improving the yield, performance over temperature, actuation, and quality of MEMS switches. It is also desirable to reduce the deformation of the beam in order to improve switch reliability. Furthermore, it is desirable to reduce switch power consumption.

DISCLOSURE OF THE INVENTION

According to one embodiment, a movable, trilayered microcomponent suspended over a substrate is provided. The trilayered microcomponent includes a first electrically conductive layer patterned to define a movable electrode. The first metal layer is separated from the substrate by a gap. The microcomponent further includes a dielectric layer formed on the first metal layer and having an end fixed with respect to the substrate. Furthermore, the microcomponent includes a second electrically conductive layer formed on the dielectric layer and patterned to define an electrode interconnect for electrically communicating with the movable electrode.

According to a second embodiment, an actuator having a movable, trilayered microcomponent is provided. The actuator includes a substrate having a stationary electrode attached thereto and a resilient structural layer including a first end fixed with respect to the substrate and a second end suspended over the substrate. The actuator further includes a movable electrode attached to the structural layer whereby the movable electrode is separated from the stationary electrode by a gap. Furthermore, the actuator includes an electrode interconnect formed on the structural layer for electrically communicating with the movable electrode.

According to a third embodiment, a microscale, electrostatically actuated switch having a movable, trilayered microcomponent is provided. The switch includes a substrate having a stationary electrode and a stationary contact attached thereto and a resilient structural layer including a first end fixed with respect to the substrate and a second end suspended over the substrate. The switch further includes a movable electrode attached to the structural layer whereby the movable electrode is separated from the stationary electrode by a gap. Furthermore, the switch includes an electrode interconnect formed on the structural layer for electrically communicating with the movable electrode.

Accordingly, it is an object to provide novel MEMS switch devices and methods as disclosed herein.

An object of the invention having been stated hereinabove, and which is achieved in whole or in part by the novel MEMS device having a trilayered beam and related methods described herein, other objects will become evident as the description proceeds when taken in connection with the accompanying drawings as best described hereinbelow.

BRIEF DESCRIPTION OF THE DRAWINGS

Exemplary embodiments of the invention will now be explained with reference to the accompanying drawings, of which:

FIG. 3 illustrates a cross-sectional front view of the stationary electrode, structural layer, movable electrode, and electrode interconnect of a MEMS switch;

FIG. 4 illustrates a top view of a MEMS switch;

FIG. 26 illustrates a perspective top view of a MEMS switch having a contact interconnect dimensioned substantially equal to and aligned with the movable contact and movable electrode; and FIG. 27 illustrates a perspective bottom view of a MEMS switch having a contact interconnect dimensioned substantially equal to and aligned with the movable contact and movable electrode.

DETAILED DESCRIPTION OF THE INVENTION

Figure 1:
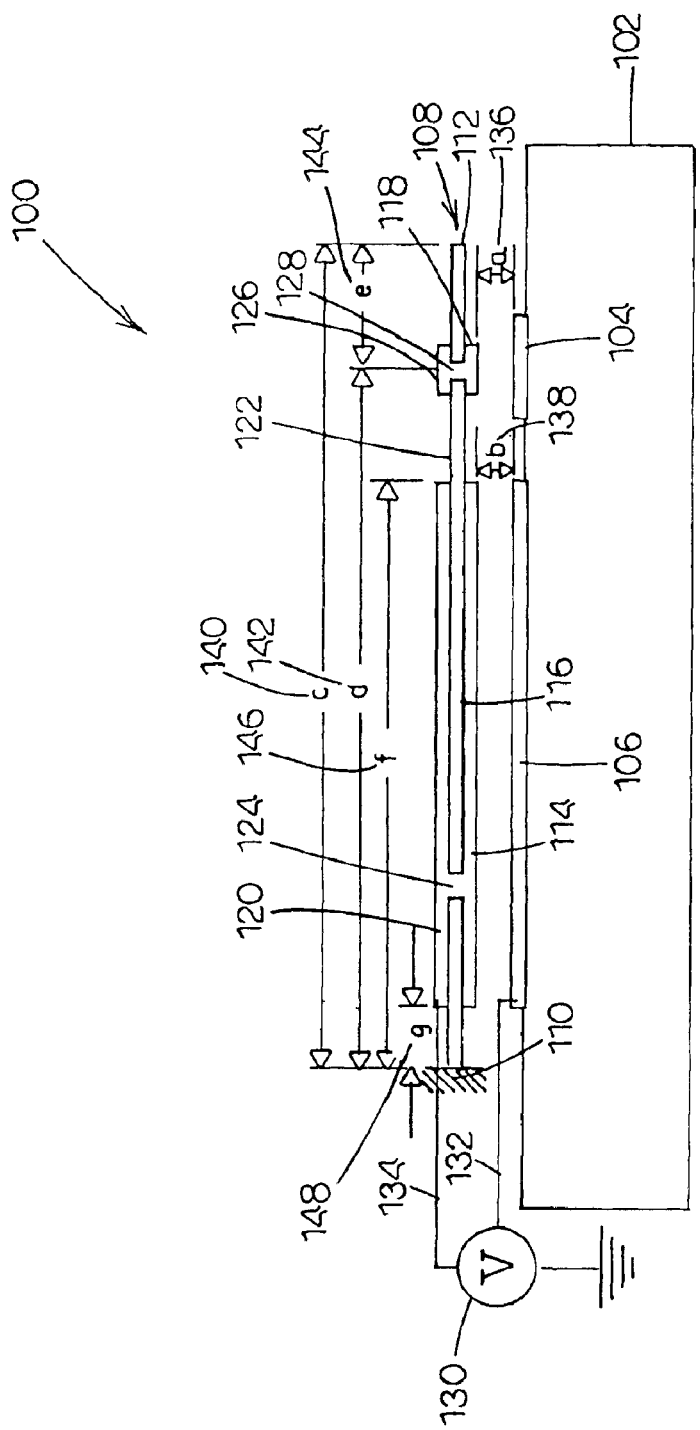
FIG. 1 illustrates a cross-sectional side view of a MEMS switch in an "open" position.

For purposes of the description herein, it is understood that when a component such as a layer or substrate is referred to herein as being deposited or formed "on" another component, that component can be directly on the other component or, alternatively, intervening components (for example, one or more buffer or transition layers, interlayers, electrodes or contacts) can also be present. Furthermore, it is understood that the terms "disposed on" and "formed on" are used interchangeably to describe how a given component is positioned or situated in relation to another component. Therefore, it will be understood that the terms "disposed on" and "formed on" do not introduce any limitations relating to particular methods of material transport, deposition, or fabrication.

Contacts, interconnects, conductive vias, and electrodes of various metals can be formed by sputtering, CVD, or evaporation. If gold, nickel or PERMALLOY™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium-tungsten (TiW). Some metal combinations can require a diffusion barrier to prevent a chromium adhesion layer from diffusing through gold. Examples of diffusion barriers between gold and chromium include platinum or nickel.

Conventional lithographic techniques can be employed in accordance with micromachining of the invention described below. Accordingly, basic lithographic process steps such as photoresist application, optical exposure, and the use of developers are not described in detail herein.

Similarly, generally known etching processes can be employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethyl) ammonium hydroxide (($CH_3)_4NOH$, also known commercially as TMAH), and ethylenediamine mixed with pyrochatechol in water (EDP) can be used for anisotropic wet etching to fabricate V-shaped or tapered grooves, trenches or cavities. Silicon nitride is typically used as the masking material against etching by KOH, and thus can used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the other alkaline etchants and EDP. Silicon oxide and silicon nitride can be used as masks against TMAH and EDP. The preferred metal used to form contacts and interconnects in accordance with the invention is gold and its alloys.

Commonly known wet etchants can be used to etch materials such as copper, gold, silicon dioxide, and secondary materials such as the adhesion and barrier materials. For example, gold can be etched with an aqueous solution of $KI_3$ in a temperature range of 20 to 50° C. As another example, chromium (a common adhesive layer) can be wet etched at 25° C. in a solution of ceric ammonium nitrate, nitric acid, and $H_2O$. Furthermore, for example, copper can be etched 25° C. in a dilute solution of nitric acid. A common method of etching silicon dioxide is with various aqueous solutions of HF or solutions of HF that are buffered with ammonium fluoride.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage is applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures. For example of a dry etching process, silicon dioxide can be etched in chemistries involving $CF_4+O_2$, $CHF_3$, $C_2F_6$, or $C_3F_8$. As another example, gold can be dry etched with $C_2Cl_2F_4$ or $C_4Cl_2F_4 +O_2$.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component."

As used herein, the term "conductive" is generally taken to encompass both conducting and semi-conducting materials.

Examples will now be described with reference to the accompanying drawings.

Referring to FIGS. 1–4, different views of a MEMS switch, generally designated 100, having a trilayered beam are illustrated. Referring specifically to FIG. 1, a cross-sectional side view of MEMS switch 100 is illustrated in an "open" position. MEMS switch 100 includes a substrate 102. Non-limiting examples of materials which substrate 102 can comprise include silicon (in single-crystal, polycrystalline, or amorphous forms), silicon oxinitride, glass, quartz, sapphire, zinc oxide, alumina, silica, or one of the various Group III–V compounds in either binary, ternary or quaternary forms (e.g., GaAs, InP, GaN, AlN, AlGaN, InGaAs, and so on). If the composition of substrate 102 is chosen to be a conductive or semi-conductive material, a non-conductive, dielectric layer can be deposited on the top surface of substrate 102, or at least on portions of the top surface where electrical contacts or conductive regions are desired.

Substrate 102 includes a first stationary contact 104, a second stationary contact (not shown), and a stationary electrode 106 formed on a surface thereof. First stationary contact 104, second stationary contact, and stationary electrode 106 can comprise a conductive material such as a metal. Alternatively, first stationary contact 104, second stationary contact, and stationary electrode 106 can comprise different conductive materials such as gold-nickel alloy (AuNi$_5$) and aluminum, respectively, and other suitable conductive materials known to those of skill in the art. The conductivity of stationary electrode 106 can be much lower than the conductivity of first stationary contact 104 and the second stationary contact. Preferably, first stationary contact 104 and the second stationary contact comprise a very high conductivity material such as copper. Preferably, first stationary contact 104 and the second stationary contact have a width range of 7 $\mu$m to 100 $\mu$m and a length range of 15 $\mu$m to 75 $\mu$m. Stationary electrode 106 can have a wide range of dimensions depending on the required actuation voltages, contact resistance, and other functional parameters. Preferably, stationary electrode 106 has a width range from 25 $\mu$m to 250 $\mu$m and the length ranges from 100 $\mu$m to 500 $\mu$m. Alternatively, the dimensions of first stationary contact 104, the second stationary contact, and stationary electrode 106 can be any dimension suitable for manufacturability and the functional requirement of the MEMS switch 100.

MEMS switch 100 further comprises a movable, trilayered beam, generally designated 108, suspended over first stationary contact 104, the second stationary contact, and stationary electrode 106. Beam 108 is fixedly attached at one end to a mount 110. Beam 108 extends substantially parallel to the top surface of substrate 102 when MEMS switch 100 is in an "open" position. Beam 108 generally comprises a dielectric structural layer 112 sandwiched between two electrically conductive layers described in more detail below. Structural layer 112 comprises a bendable material, preferably silicon oxide (SiO$_2$, as it is sputtered, electroplated, spun-on, or otherwise deposited), to deflect towards substrate 102 for operating in a "closed" position. Structural layer 112 provides electrical isolation and desirable mechanical properties including resiliency properties. Alternatively, structural layer 112 can comprise silicon nitride (Si$_x$N$_y$), silicon oxynitride, alumina or aluminum oxide (Al$_x$O$_y$), polymers, CVD diamond, their alloys, or any other suitable resilient materials known to those of skill in the art.

Beam 108 further includes a movable electrode 114 attached to an underside 116 of structural layer 112. Movable electrode 114 forms a second layer of beam 108. Movable electrode 114 is positioned over stationary electrode 106 and displaced from stationary electrode 106 by an air gap. Beam 108 is moved in a direction towards substrate 102 by the application of a voltage difference across stationary electrode 106 and movable electrode 114. The application of the voltage difference to stationary electrode 106 and movable electrode 114 creates an electrostatic field, which causes beam 108 to deflect towards substrate 102. The operation of MEMS switch 100 is described in further detail below.

Movable electrode 114 can be dimensioned substantially the same as stationary electrode 106. The maximum electrostatic coupling, thereby actuation force, are produced by matching the dimensions of movable electrode 114 and stationary electrode 106. This consideration ignores any contribution from fringing field effects at the edge of the respective electrodes. The disadvantages of matching the dimensions of movable electrode 114 and stationary electrode 106 can be overcome by mismatching their respective dimensions. By making stationary electrode 106 larger in extent than movable electrode 114, the manufacturing process tolerances and manufacturing alignment tolerances have a minimized effect on the actuation response. A second consideration is the intensification of the electric field between movable electrode 114 and stationary electrode 106, which is increased by the closest proximity of the edges of these two electrodes. Because of dielectric or gas breakdown issues, it is desirable to move far apart the edges of these two electrodes. A third consideration is shielding, whereby stationary electrode 106 can shield movable electrode 114 from charge or other electric potentials on substrate 102.

Movable electrode 114 and stationary electrode 106 can comprise similar materials, such as gold, such that the manufacturing process is simplified by the minimization of the number of different materials required for fabrication. Movable electrode 114 and stationary electrode 106 can comprise conductors (gold, platinum, aluminum, palladium, copper, tungsten, nickel, and other materials known to those of skill in the art), conductive oxides (indium tin oxide), and low resistivity semiconductors (silicon, polysilicon, and other materials known to those of skill in the art). Movable electrode 114 comprises a conductive material that includes adhesion layers (Cr, Ti, TiW, etc.) between movable electrode 114 and structural material 112. Movable electrode 114 comprises a conductive material and an adhesion layer that includes diffusion barriers for preventing diffusion of the adhesion layer through the electrode material, the conductor material through the adhesion layer or into the structural material. Movable electrode 114 and stationary electrode 106 can also comprise different materials for breakdown or arcing considerations, for "stiction" considerations during wet chemical processing, or because of fabrications process compatibility issues.

Beam 108 further includes an electrically conductive movable contact 118 attached to underside 116 of structural layer 112 and suspended over first stationary contact 104 and the second stationary contact (not shown). The movable contact 118 is positioned in this manner so that it will provide a connection between first stationary contact 104 and the second stationary contact when beam 108 is in the "closed" position, thus providing electrical communication between first stationary contact 104 and the second stationary contact. Movable contact 118 is displaced from first stationary contact 104 and the second stationary contact by an air gap when MEMS switch 100 is operating in the "open" position. When MEMS switch 100 is moved to the "closed" position, movable contact 118, first stationary contact 104, and the second stationary contact are in electrical communication. Movable contact 118 is dimensioned smaller than first stationary contact 104 and the second stationary contact to facilitate contact when process variability and alignment variability are taken into consideration. First stationary contact 104 and second stationary contact need to be sized appropriately so that movable contact 118 always makes contact with first stationary contact 104 and the second stationary contact on actuation. A second consideration that determines the size of movable contact 118, first stationary contact 104, and the second stationary contact is the parasitic response of switch 100. The parasitic actuation response (or "self-actuation") is generated by electric fields produced by potential differences between movable electrode 118 and stationary electrode 106, or by charge (or potential) differences between first stationary electrode 106 and second stationary contact and beam 108 that produce electric fields and a force on movable contact 118. The dimensions of movable contact 118 are connected to the dimensions of movable electrode 114 to achieve a specific ratio of the parasitic actuation to the actuation voltage.

In this embodiment, movable contact 118 is formed of the same conductive material as movable electrode 114 because they are formed from the same layer. Movable contact 118 and movable electrode 114 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (silicon, polysilicon, and other suitable materials known to those of skill in the art). Movable contact 118 comprises a conductive material that includes adhesion layers (Cr, Ti, TiW, and other suitable materials known to those of skill in the art) between movable contact 118 and structural layer 112. Movable contact 118 comprises a conductive material and adhesion layer that includes diffusion barriers for preventing diffusion of the adhesion layer through the electrode material, the conductor material through the adhesion layer or into the structural material. The fabrication process is simplified by having movable contact 118 and movable electrode 114 manufactured of the same material that is deposited and patterned during the same photolithography steps. This is not a necessary requirement for the operation of the switch because of the requirements for movable contact 118 and movable electrode 114 materials are different. Preferably, movable electrode 114 comprises a material having good conductive properties and other desirable properties of suitable contacts known to those of skill in the art. Preferably, movable contact 118 comprises a material having low resistivity, low hardness, low oxidation, low wear, and other desirable properties of suitable contacts known to those of skill in the art.

Beam 108 further includes an electrode interconnect 120 attached to a topside 122 of structural layer 112. Electrode interconnect 120 forms a third layer on beam 108. As shown, electrode interconnect 120 is attached to an opposite side of structural layer 112 from movable electrode 114. Electrode interconnect 120 is dimensioned substantially the same as movable electrode 114. In this embodiment, electrode interconnect 120 has the same dimensions as movable electrode 114 and is aligned with movable electrode 114. Alternatively, electrode interconnect 120 can have different dimensions and extent than movable electrode 114. Preferably, electrode interconnect 120 has the same dimensions as movable electrode 114 and is aligned with movable electrode 114 in order to achieve a manufacturable flatness that is maintained over temperature. In this embodiment, electrode interconnect 120 comprises a conductive material having the same coefficient of thermal expansion, elastic modulus, residual film stress, and other electrical/mechanical properties as movable electrode 114. Electrode interconnect 120 and movable electrode 114 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (e.g., silicon, polysilicon, and other suitable materials known to those of skill in the art). Alternatively, electrode interconnect 120 comprises a conductive material that is different from the conductive material comprising the movable electrode 114.

An adhesion layer can be disposed between electrical interconnect 120 and structural layer 112. Adhesion layer can include diffusion barriers for preventing diffusions of the adhesion layer through the conductive electrode material, the conductor material through the adhesion layer or into the structural material.

Electrode interconnect 120 is electrically connected to movable electrode 114 by an interconnect via 124. Interconnect via 124 comprises a conductive material formed through structural layer 112 for electrically connecting movable electrode 114 and electrode interconnect 120. Interconnect via 124 comprises the same conductive material as electrode interconnect 120 and movable electrode 114. Alternatively, interconnect via 124 can comprise a different conductive material than electrode interconnect 120 and movable electrode 114.

Beam 108 further includes a contact interconnect 126 attached to topside 122 of structural layer 112. As shown, contact interconnect 126 is attached to a side of structural layer 112 opposite from movable contact 118. Contact interconnect 126 is dimensioned substantially the same as movable contact 118. The contact interconnect 126 and movable contact 118 are aligned with respect to each other and have the same dimensions. Alternatively, contact interconnect 126 can have different dimensions and extent than movable contact 118. It is intended to maintain geometric equivalence by management of the mechanical form. Contact interconnect 126 and movable contact 118 are intended to share a geometrical and thermo-mechanical equivalence. This equivalence provides beam, which can achieve a manufacturable flatness that is maintained over temperature and other environmental conditions, such as die attachment, package lid seal processes, or solder reflow process. In this embodiment, contact interconnect 126 comprises a conductive material having the same coefficient of thermal expansion, elastic modulus, residual film stress, and other desirable electrical/mechanical properties known to those of skill in the art as movable contact 118. Contact interconnect 126 and movable contact 118 can comprise conductors (e.g., gold, platinum, aluminum, palladium, copper, tungsten, nickel, and other suitable materials known to those of skill in the art), conductive oxides (e.g., indium tin oxide and other suitable materials known to those of skill in the art), and low resistivity semiconductors (silicon, polysilicon, and other suitable materials known to those of skill in the art). Contact interconnect 126 comprises a conductive material that includes adhesion layer (e.g., Cr, Ti, TiW, and other suitable materials known to those of skill in the art) between contact interconnect 126 and structural material 112. Contact interconnect 126 comprises a conductive material and adhesion layer that includes diffusion barriers for preventing diffusion of the adhesion layer through the electrode material, the conductor material through the adhesion layer or into the structural material. Alternatively, interconnect electrode 126 can comprise a conductive material that is different than the conductive material comprising movable contact 118. This alternative embodiment requires that the interconnect contact be designed to have dimension such that it geometrically and thermomechanically balance the difference in material properties. Contact interconnect 126 is electrically connected to movable contact 118 by a second interconnect via 128. Second interconnect via 128 comprises a conductive material formed through structural layer 112 for electrically connecting movable contact 118 and contact interconnect 126. Second interconnect via 128 comprises the same conductive material as contact interconnect 126 and movable contact 118. Second interconnect via 128 can comprise a different conductive material as contact interconnect 126 and movable contact 118. For example, second interconnect via 128 can comprise tungsten or aluminum, whereas contact interconnect 126 and movable contact 118 can comprise, for example, gold. In this embodiment, second interconnect via 128 comprises the same material as interconnect via 124, interconnect electrode 120, and contact interconnect 126. Alternatively, second interconnect via 128 can comprise different materials than interconnect via 124, interconnect electrode 120, or contact interconnect 126.

Figure 2:
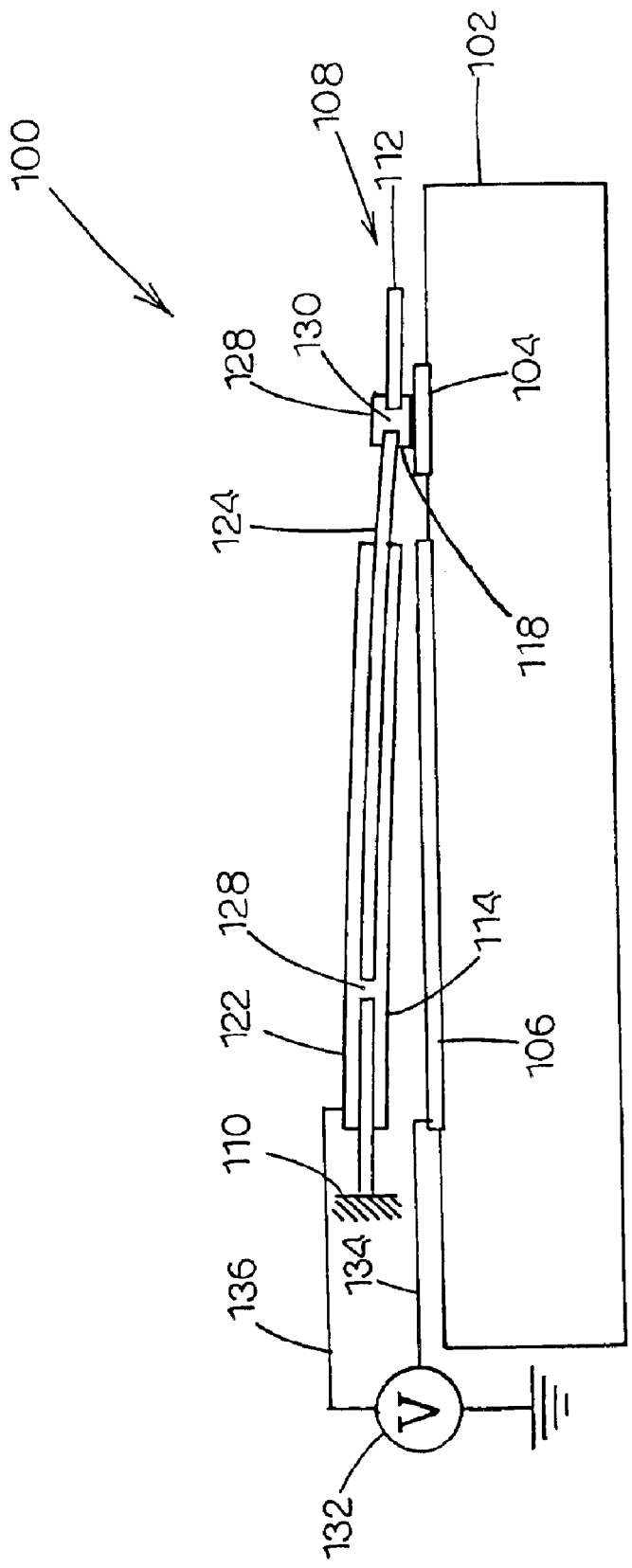
FIG. 2 illustrates a cross-sectional side view of a MEMS switch in a "closed" position.

MEMS switch 100 is operated by applying a potential voltage difference between movable electrode 114 and stationary electrode 106. The applied potential voltage causes beam 108 to deflect towards substrate 102 until movable contact 118 touches first stationary contact 104 and the second stationary contact, thus establishing an electrical connection between movable contact 118 and first stationary contact 104 and second stationary contact. Referring to FIG. 2, a cross-sectional side view of MEMS switch 100 is illustrated in a "closed" position. As shown in the "closed" position, movable contact 118 is touching first stationary contact 104 and the second stationary contact. As described below, the components of MEMS switch 100 are dimensioned such that movable electrode 114 does not contact stationary electrode 106 in the "closed" position, thus preventing a short between components 106 and 114. Furthermore, the components of MEMS switch 100 are dimensioned such that first stationary contact 104 and second stationary contact touches movable contact 118 in the "closed" position. MEMS switch 100 is returned to an "open" position by sufficiently reducing or removing the voltage difference applied across stationary electrode 106 and movable electrode 114. This in turn reduces the attractive force between movable electrode 114 and stationary electrode 106 such that the resiliency of structural layer 112 enables structural layer 112 to return to a position substantially parallel to the surface of substrate 102.

Referring now to FIG. 1, a voltage source 130 provides the voltage difference between stationary electrode 106 and movable electrode 114. The voltage source here is set to 0 Volts. Stationary electrode 106 is directly connected to voltage source through a conductive line 132. Movable electrode 114 is electrically connected to voltage source 130 through interconnect via 124, electrode interconnect 120, and a second conductive line 134. Conductive line 134 provides a connection between voltage source 130 and electrode interconnect 120. Interconnect via 124 provides a connection between electrode interconnect 120 and movable electrode 114. Therefore, on the application of a voltage by voltage source 130, a voltage difference is created between stationary electrode 106 and movable electrode 114. This establishes electrostatic coupling between movable electrode 114 and stationary electrode 106 across the air gap. Alternatively, the gap between movable electrode 114 and stationary electrode 106 can be any suitable isolating gas or fluid as known to those of skill in the art.

First stationary contact 104, second stationary contact, stationary electrode 106, movable contact 110, movable electrode 112, electrode interconnect 120, contact interconnect 128, and interconnect vias 124 and 128 comprise a metal in this embodiment. Preferably, movable electrode 114 and electrode interconnect 120 are fabricated of the same material and dimensioned the same in order to perform two functions. First, it provides mechanical balance on both sides of structural layer 112. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 112. This means that any functional variation exhibited by MEMS switch 100 depends primarily on the process variation, which can be minimized by the appropriate optimization of the design in the process. Secondly, because movable contact 118 and contact interconnect 126 are fabricated of the same material and dimensioned the same, the current carrying capacity of the contact is aided. It is preferable that beam 108 has the same type of metal, deposited by the same process, patterned in the same geometry, and deposited to the same thickness, but the use of different materials could be accommodated with the appropriate design and characterization. To address the issues of contact adhesion, cold welding, or hot welding, first stationary contact 104, second stationary contact, stationary electrode 106, movable electrode 114, movable contact 118, electrode interconnect 120, contact interconnect 126, and interconnect vias 124 and 128 could be different materials or different alloys of the same materials. The material selection minimizes contact resistance and failures such as stiction.

In the "open" position, movable contact 118 is separated from first stationary contact 104 and second stationary contact by a gap distance a 136 as shown in FIG. 1. Movable electrode 114 is separated from stationary electrode 106 by a gap distance b 138. In this embodiment, distance a 136 is less distance b 138. If distance a 136 is less distance b 138, the operation of MEMS switch 100 is more reliable because movable contact 118 and stationary contact 104 establish contact first, thereby reducing the potential for shorting between stationary electrode 106 and movable electrode 114 is reduced. The length of beam 108 is indicated by a distance c 140. The center of movable contact 118 is a distance d 142 from mount 110 and a distance e 144 from the end of beam 108 that is distal mount 110. The edge of electrode interconnect 120 distal mount 110 is a distance f 146 from mount 110. The edge of electrode interconnect 120 near mount 110 is a distance g 148 from mount 110. In this embodiment, distance a 136 is nominally 1.5 microns; distance b 138 is preferably 2 microns; distance c 140 is preferably 155 microns; distance d 142 is preferably 135 microns; distance e 144 is preferably 20 microns; distance f 146 is preferably 105 microns; and distance g 148 is 10 microns. The distances a 136, b 138, c 140, d 142, e 144, f 146, and g 148 provide desirable functional performance, but other dimensions can be selected to optimize other functional characteristics, manufacturability, and reliability.

Referring to FIG. 3, a cross-sectional front view of stationary electrode 106, structural layer 112, movable electrode 114, and electrode interconnect 120 of MEMS switch 100 is illustrated. The width of movable electrode 114 is indicated by a distance a 300. The width of electrode interconnect 120 is indicated by a distance b 302. Preferably, movable electrode 114 and electrode interconnect 120 are equal in width. Alternatively, movable electrode 114 and electrode interconnect 120 can have different widths. The width of stationary electrode 106 is indicated by distance c 304. The width of structural layer 112 is indicated by distance d 306. The thicknesses of movable electrode 114, electrode interconnect 120, and stationary electrode 106 are indicated by distances e 308, f 310, and g 312, respectively. The thickness of structural layer 112 is indicated by distance h 314. First stationary contact 104 and stationary electrode 106 can be dimensioned greater than movable electrode 114 and movable contact 118, respectively, in order to facilitate shielding MEMS switch 100 from any parasitic voltages. In this embodiment, distance a 300 is preferably 75 microns; distance b 302 is preferably 75 microns; distance c 304 is preferably 95 microns; distance d 306 is preferably 85 microns; distance e 308 is preferably 0.5 microns; distance f 310 is preferably 0.5 microns; distance g 312 is preferably between 0.3 and 0.5 microns; and distance h 314 is preferably 2 microns. The distances a 300, b 302, c 304, d 306, e 308, f 310, g 312, and h 314 provide desirable functional performance, but other dimensions can be selected to optimize other functional characteristics, manufacturability, and reliability.

Referring to FIG. 4, a top view of MEMS switch 100 is illustrated. As shown, electrode interconnect 120 and contact interconnect 126 are generally rectangular in shape. Furthermore, electrode interconnect 120 and contact interconnect 126 are rectangular in shape with the external corners rounded to eliminate the sharp corner. In the case wherein electrode interconnect 120 and contact interconnect 126 are shaped to contain internal reentrant corners, these internal corners can be rounded to eliminate the sharp corner. The sharp corners are rounded to reduce the intensification in the electric fields produced by the potential differences between conductors. In this embodiment, movable electrode 114 is dimensioned the same as electrode interconnect 120. Alternatively, electrode interconnect 120 can be another shape which substantially matches the shape of movable electrode 114. Furthermore, the shape of contact interconnect 126 substantially matches the shape of movable contact 118. First and second interconnect vias 124 and 128 are shown by broken lines. First and second interconnect vias 124 and 128 are shown as rectangular, but, alternatively, they can be any geometry suitable for vias including circular, elliptical, or rectangular with rounded corners. The width of electrode interconnect 120 is substantially equal to the width of contact interconnect 126. In this embodiment, the width of electrode interconnect 120 and contact interconnect 126 is 75 microns.

Figure 5:
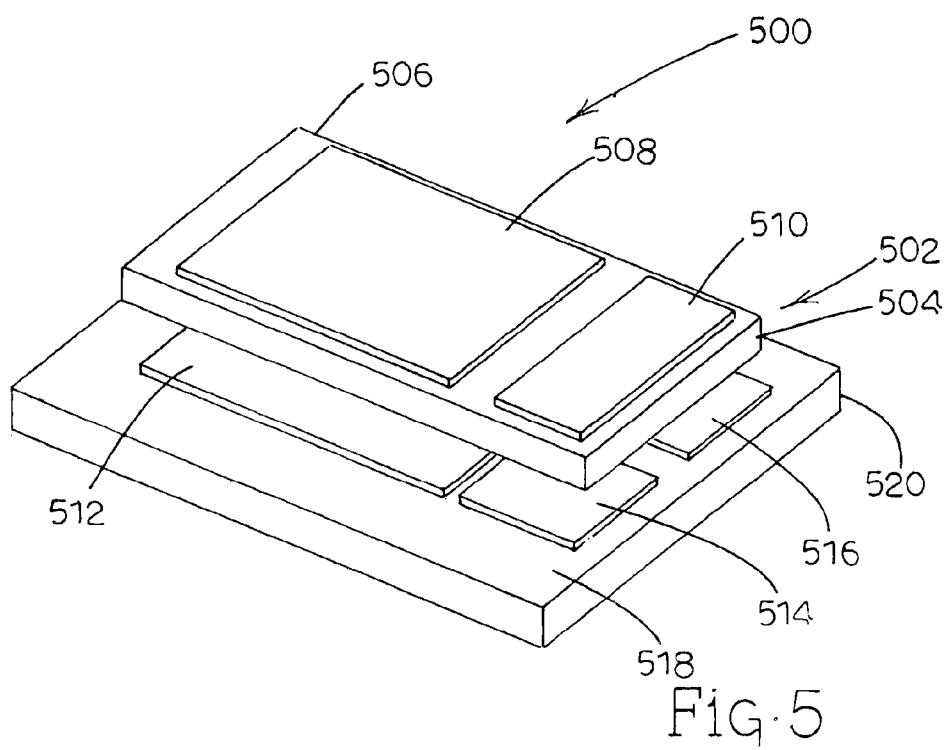
FIG. 5 illustrates a perspective top view of a MEMS switch.
Figure 6:
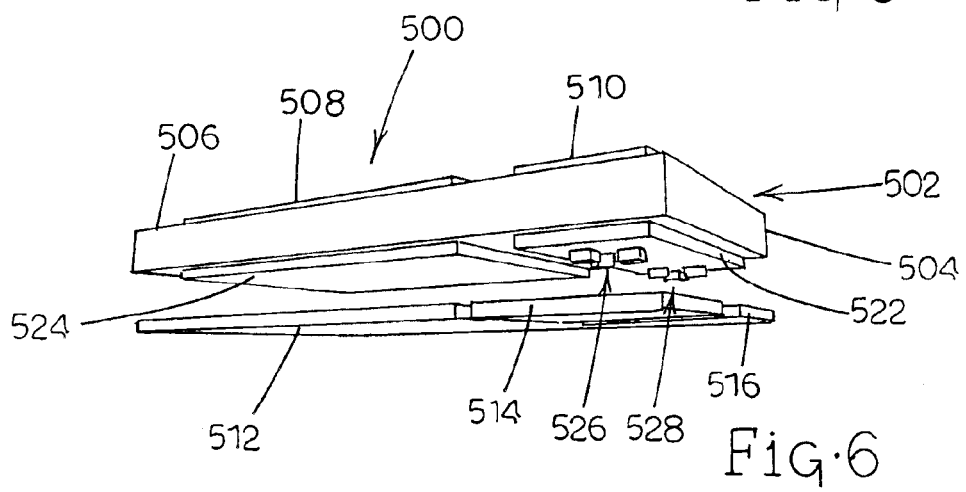
FIG. 6 illustrates a perspective bottom view of a MEMS switch having contact bumps.

Referring to FIGS. 5 and 6, different views of another MEMS switch, generally designated 500, in accordance with another embodiment of the present invention are illustrated. Referring specifically to FIG. 5, a perspective top view of MEMS switch 500 is illustrated. MEMS switch 500 includes a beam, generally designated 502, having a structural layer 504 attached at an end 506 to a mount (not shown). Beam 502 further includes an electrode interconnect 508 and a contact interconnect 510 attached to the top side of structural layer 504. A movable electrode (shown in FIG. 6) and a contact electrode (shown in FIG. 6) is positioned on the under side of structural layer 504 in alignment with and dimensioned substantially the same as electrode interconnect 508 and a contact interconnect 510, respectively. Electrode interconnect 508 and contact interconnect 510 are electrically connected to the movable electrode and the movable contact, respectively, through structural layer 504 by interconnect vias as described above.

Referring now to FIG. 6, MEMS switch 500 further includes a stationary electrode 512 and stationary contacts 514 and 516 attached to a surface 518 of a substrate 520 (shown in FIG. 5). Beam 502 further includes a movable contact 522 attached to the underside of structural layer 504. Movable contact 522 contacts 514 and 516 when MEMS switch 500 is operating in a "closed" position. Thus, in a "closed" position, stationary contacts 514 and 516 are electrically connected via movable contact 522 or via contact interconnect 510. Movable contact 522 further includes a first and second set of contact bumps, generally designated 526 and 528, respectively. Contact bumps 526 and 528 comprise a conductive material for facilitating electrical communication between stationary contacts 514 and 516 in the "closed" position. Contact bumps 526 and 528 reduce the gap distance between movable contact 522 and stationary contacts 514 and 516, thus reducing the potential for shorting between stationary electrode 512 and movable electrode 524. Contact bumps 526 and 528 provide for reliable contact with stationary contacts 514 and 516. Without standoff bumps 526 and 528, there could be interference between movable contact 522 and surface 518 and between stationary contacts 514 and 516. Contact bumps 526 and 528 provide design flexibility to meet contact resistance and current capacity requirements. This can be achieved by design through optimization of the following variables: contact bump geometry (e.g., circular, square, elliptical, rectangular, hemispherical, and other shapes), contact bump dimensions (preferably 5 microns), numbers of contact bumps (three in this embodiment), and the geometric pattern of the contact bumps (e.g., rectangular pattern or triangular pattern, elliptical pattern, star pattern, and other patterns). In this embodiment, circular cylindrical contact bumps are shown in a triangular grouping of three contact bumps having one contact bump leading two others. Furthermore, contact bumps 526 and 528 can be considered a macro definition of contact asperities, which are normally determined by the surface roughness of the contacting surfaces. The contact resistance and current capacity are determined by the number of microscopic asperities, so the macroscopic definition of asperities is though to enhance the design space.

Figure 7:
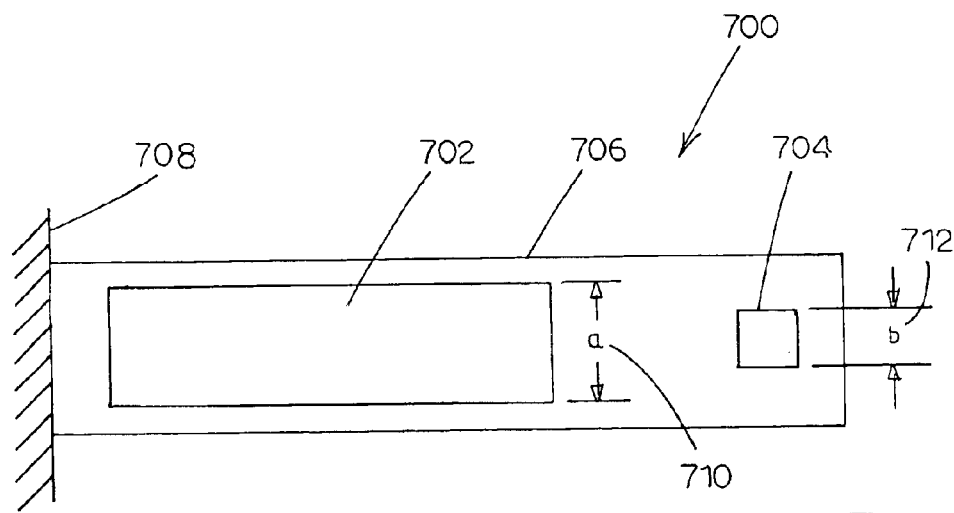
FIG. 7 illustrates a top view of another embodiment of a MEMS switch wherein the electrode interconnect width is greater than the contact interconnect width.

Referring to FIG. 7, a top view of another embodiment of a MEMS switch 700 in accordance with the present invention is illustrated. MEMS switch 700 includes an electrode interconnect 702 and a contact interconnect 704. Electrode interconnect 702 and contact interconnect 704 are attached to the top surface of structural layer 706. Structural layer 706 is connected at one end to a mount 708. In a configuration analogous to that of embodiments previously described herein, MEMS switch 700 also comprises a movable electrode and a movable contact (not shown) attached to the bottom side of structural layer 706. Preferably, electrode interconnect 702 and contact interconnect 704 are dimensioned substantially the same as the movable electrode and movable contact provided in this embodiment, respectively. Electrode interconnect 702 and contact interconnect 704 are electrically connected to the movable electrode and the movable contact, respectively, through structural layer 706 by interconnect vias as described above. Furthermore, MEMS switch 700 includes a stationary electrode (not shown) and first and second stationary contacts (not shown) connected to a substrate (not shown). The stationary electrode and the first and second stationary contacts are dimensioned substantially the same as electrode interconnect 702 and contact interconnect 704, respectively, as described above.

The width of electrode interconnect 702 is indicated by a distance a 710. The width of contact interconnect 710 is indicated by a distance b 712. Preferably, distance a 710 is 75 microns and distance b 712 is 15 microns. The width of electrode interconnect 702 is greater than the width of contact interconnect 704. Thus, the size of contact interconnect 704 and its corresponding movable contact is smaller with respect to electrode interconnect 702 and its movable electrode, respectively, than the above-mentioned embodiments. This reduction in the proportion of contact interconnect 704 to electrode interconnect 702 can reduce the potential for parasitic voltage creating an unwanted actuation of MEMS switch 700. Parasitic voltage across the movable contact and the first and second stationary contacts can create an electrostatic force pulling MEMS switch to the substrate. By reducing the size of the contact, parasitic voltage is reduced, thus reducing the unwanted attractive force between the contacts. Therefore, the width of the movable electrode is greater than the width of the movable contact. The difference in the widths of the movable electrode and movable contact is advantageous in enhancing the isolation of the moving contact from the actuator portion of MEMS switch 700, so as to prevent undesirable parasitic actuation from occurring as a result of, e.g., a voltage spike. Since the area of the movable electrode is rendered smaller, electrostatic pressure (i.e., electrostatic force per unit area) is minimized at the contact while maximized at the actuator. As stated above, manufacturing the movable contact and contact interconnect more narrow in width than the movable electrode and electrode interconnect improves the ratio of the actuation voltage to the parasitic actuation voltage. The MEMS switch 700 decouples the width of the movable electrode and electrode interconnect and the width of the movable contact and contact interconnect. By decoupling the widths, the electrostatic force for actuation is decoupled from the parasitic actuation due to the parasitic actuation voltage. Since the electrostatic actuation force is decoupled from the parasitic actuation force, the width of the movable electrode can be increased to enhance the actuation force while further detracting from the parasitic actuation. This is accomplished because, as the width of the movable electrode increases, actuation voltage remains constant but the stiffness seen by the parasitic actuation has increased, thereby, increasing the parasitic actuation voltage.

Figure 8:
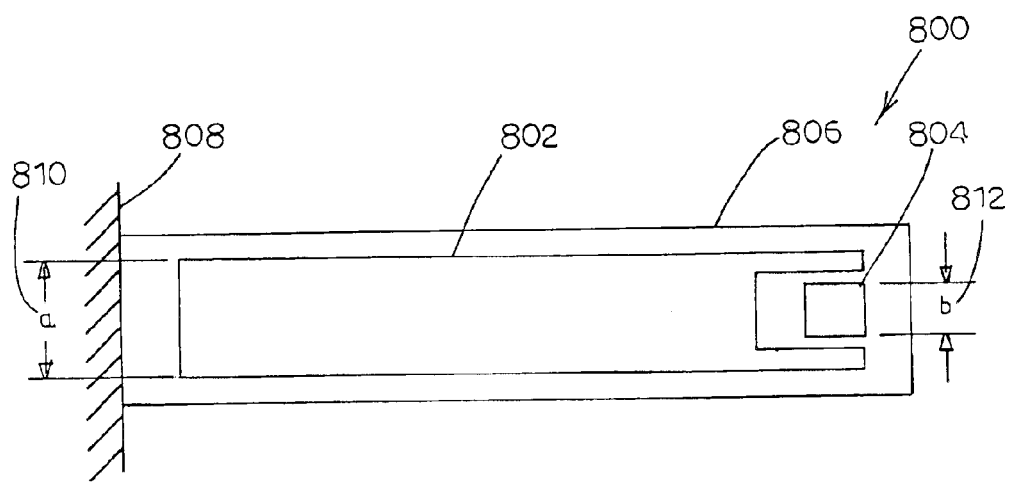
FIG. 8 illustrates a top view of another embodiment of a MEMS switch wherein the electrode interconnect extends adjacent the contact interconnect.

Referring to FIG. 8, a top view of another embodiment of a MEMS switch 800 in accordance with the present invention is illustrated. MEMS switch 800 includes an electrode interconnect 802 and a contact interconnect 804. Electrode interconnect 802 and contact interconnect 804 are attached to the top surface of structural layer 806. Structural layer 806 is connected at one end to a mount 808. Electrode interconnect 802 and contact interconnect 804 are dimensioned substantially the same as a movable electrode (not shown) and a movable contact (not shown), respectively. The movable electrode and movable contact are attached to the bottom side of structural layer 806. Electrode interconnect 802 and contact interconnect 804 are electrically connected to the movable electrode and the movable contact, respectively, through structural layer 806 by interconnect vias as described above. Furthermore, MEMS switch includes a stationary electrode (not shown) and first and second stationary contacts (not shown) connected to a substrate (not shown). The stationary electrode and the first and second stationary contacts are dimensioned substantially the same as electrode interconnect 802 and contact interconnect 804, respectively, as described above.

The width of electrode interconnect 802 is indicated by a distance a 810. The width of contact interconnect 802 is indicated by a distance b 812. Electrode interconnect 802 is extended in this embodiment to partially surround contact interconnect 804, while remaining electrically isolated from contact interconnect 804. Consequently, the center of the electrostatic pressure of the stationary electrode, the movable electrode, and electrode interconnect 804 are moved to a position further from anchor 808. Thus, in operation, the center of the attractive force between the stationary electrode and movable electrode is moved to a position further from anchor 808. Because the center of force is a greater distance from the pivot point of the beam, i.e., anchor 808, less force is required to deflect the beam to a "closed" position. Thus, less power is required. Thus, this arrangement aides in preventing unwanted actuation resulting from parasitic voltages. This unwanted actuation is minimized because the ratio of the actuation voltage to the parasitic actuation voltage has improved (i.e., smaller). In this case, the actuation voltage can be reduced for a fixed parasitic actuation voltage or can be fixed for an increasing parasitic actuation voltage. The extension of electrode interconnect 802 to partially surround contact interconnect 804 will minimize the available area of oxide that would otherwise be available to store free charge, which could perturb functionality.

Figure 9:
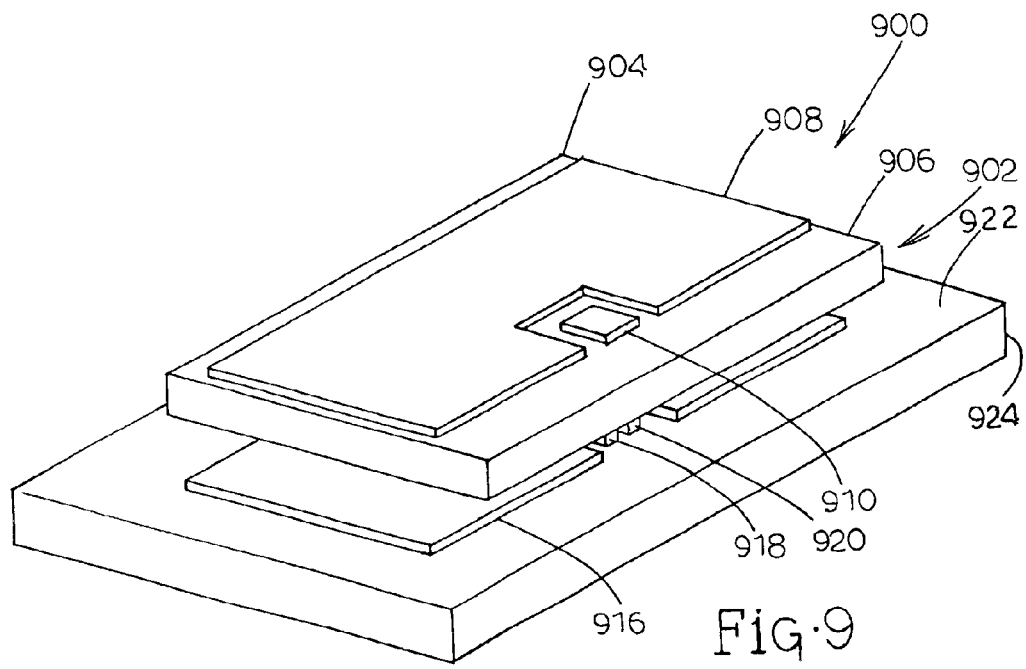
FIG. 9 illustrates a perspective top view of a MEMS switch wherein the electrode interconnect is substantially wider and extends adjacent the contact interconnect.
Figure 10:
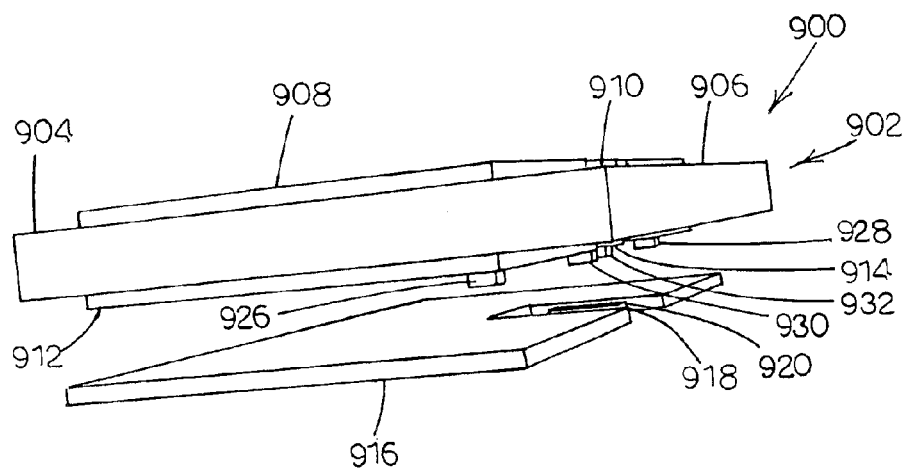
FIG. 10 illustrates a perspective side view of a MEMS switch in accordance with the present invention.

Referring to FIGS. 9 and 10, different views of another MEMS switch, generally designated 900, in accordance with another embodiment of the present invention are illustrated. Referring specifically to FIG. 9, a perspective top view of MEMS switch 900 is illustrated. MEMS switch 900 includes a beam, generally designated 902, attached at one end 904 to a mount (not shown). Beam 902 is attached to the mount via a structural layer 906. Beam 902 further includes an electrode interconnect 908 and a contact interconnect 910 attached to the top side of structural layer 906. A movable electrode 912 (shown in FIG. 10) and a contact electrode 914 (shown in FIG. 10) are attached to the under side of structural layer 906 and positioned in alignment with and dimensioned substantially the same as electrode interconnect 908 and a contact interconnect 910, respectively. Electrode interconnect 908 and contact interconnect 910 are electrically connected to the movable electrode and the movable contact, respectively, through structural layer 906 by interconnect vias as described above.

MEMS switch 900 further includes a stationary electrode 916 and first and second contact electrodes 918 and 920, respectively, formed on a surface 922 of a substrate 924. Stationary electrode 916 and contact interconnect 918 are in alignment with and dimensioned substantially the same as electrode interconnect 908 and a contact interconnect 910, respectively. End 904 of beam 902 is fixed with respect to substrate 924. As shown, electrode interconnect 908 partially surrounds contact interconnect 910. As described above, the arrangement of the electrode interconnect, movable electrode, and stationary electrode further from the anchor reduces the power necessary to move the MEMS switch to a "closed" position. Additionally, this configuration aides in preventing unwanted actuation resulting from parasitic voltages. As shown in this embodiment, electrode interconnect 908, movable electrode 912, and stationary electrode 916 are wider in relation to the contact as compared with embodiments previously described herein.

Movable electrode 912 includes first and second standoff bumps 926 and 928, respectively, comprising a non-conductive material. Standoff bumps 926 and 928 serve to prevent shorting between movable electrode 912 and stationary electrode 916. As beam 902 is deflected towards stationary electrode 916 during operation, movable electrode 912 is prevented from contacting stationary electrode 916 because standoff bumps 926 and 928 protrude from movable electrode 912 in the direction of stationary electrode 916. Movable contact 914 further includes first and second contact bumps 930 and 932 comprising a conductive material. First and second contact bumps 930 and 932 extend beyond standoff bumps 926 and 928 for contacting first and second stationary contacts 918 and 920, respectively, before standoff bumps 926 and 928 during an operation to "close" MEMS switch 900. In this embodiment, contact bumps 930 and 932 have equal extension as standoff bumps 926 and 928 because of the simplified process flow. The optimal placement of standoff bumps 926 and 928 is such that a maximum overdrive voltage (applied between stationary electrode 916 and movable electrode 912) can be supported without shorting the actuation electrodes but maximizing the contact force (i.e., minimizing the contact resistance). This implies standoff bumps 926 and 928 are placed some distance behind (closer to fixed end 904 of beam 902) contact bumps 930 and 932. In this configuration, contact bumps 930 and 932 establishes contact with stationary contact 918 before standoff bumps 926 and 928 establish contact with stationary electrode 916. Once contact bumps 930 and 932 establishes contact, the actuation voltage can be further increased to increase the contact force and decrease the contact resistance. The contact resistance will decrease further until standoff bumps 926 and 928 establish contact with stationary electrode 916. At this point, the contact resistance and chance of shorting will begin to increase. In this manner, standoff bumps 926 and 928 have not detracted from the ability to develop substantial contact force and minimize contact resistance. Preferably, the standoff bumps are placed across the width of the beam such that as the width of the beam increases the number of standoff bumps will increase proportionally to preserve the switch isolation. Another key element of the standoff bump placement is to minimize the total area consumed by the standoff bumps because they will detract from the electrostatic force that can be generated.

Figure 11:
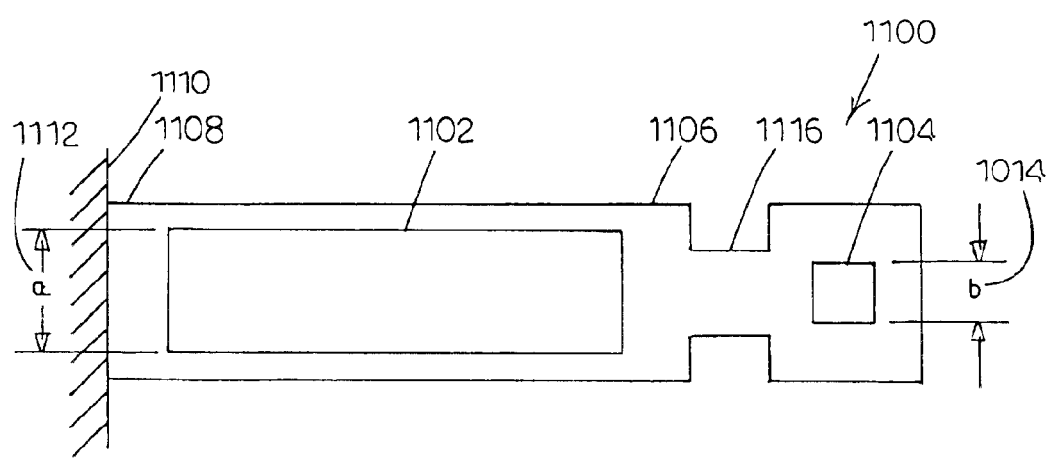
FIG. 11 illustrates a top view of an embodiment of a MEMS switch having an isolation zone with a reduced width between the electrode interconnect and the contact interconnect.

Referring to FIG. 11, a top view of another embodiment of a MEMS switch 1100 in accordance with the present invention is illustrated. MEMS switch 1100 includes an electrode interconnect 1102 and a contact interconnect 1104 attached to the top surface of a structural layer 1106. Structural layer 1106 is connected at an end 1108 to a mount 1110. Electrode interconnect 1102 and contact interconnect 1104 are dimensioned substantially the same as a movable electrode (not shown) and a movable contact (not shown), respectively, attached in alignment to the bottom side of structural layer 1106. Electrode interconnect 1102 and contact interconnect 1104 are electrically connected to the movable electrode and the movable contact, respectively, through structural layer 1106 by interconnect vias as described above. The width of electrode interconnect 1102 is indicated by a distance a 1112. The width of contact interconnect 1102 is indicated by a distance b 1114. Structural layer 1106 includes a narrowed isolation zone 1116 for improving the contact made by actuating MEMS switch 1100. Contact is improved by applying an overdrive voltage to electrode interconnect 1102 and the stationary electrode (not shown). The overdrive voltage is applied between the movable electrode (not shown) and the stationary electrode (not shown), thus, it is simply an extension of the actuation voltage. The actuation voltage is the minimum voltage required to cause the movable contact (not shown) to "close" upon the stationary contacts and establish electrical connection. The overdrive voltage is the voltage that exceeds the actuation voltage and is the voltage that contributes to the increase in the contact forces.

The forces developed by the overdrive voltage are divided between fixed end 1110 of beam 1108 and the contact of the movable contact and the stationary contacts, meaning that the forces are pulling to deform a stiffer beam because it is supported at two ends. The total stiffness of the beam is reduced by adding the narrowed isolation zone 1116. The overdrive voltage can be reduced, without impacting the actuation voltage, by making the isolation zone 1116 narrower in relation to the contact area. The narrow isolation zone 1116 reduces the force necessary to deflect the movable contact (not shown) into contact with the stationary contact (not shown). The design of narrow isolation zone must preserve the parasitic actuation requirements and the contact breaking forces. Once the overdrive and actuation voltage between the movable electrode and the stationary electrode is reduced sufficiently, the switch should return to an "open" position. This means that the elastic strain energy stored in the deformed beam needs to be great enough to overcome the energetics of adhesion between the movable contact and the stationary contacts.

Figure 12:
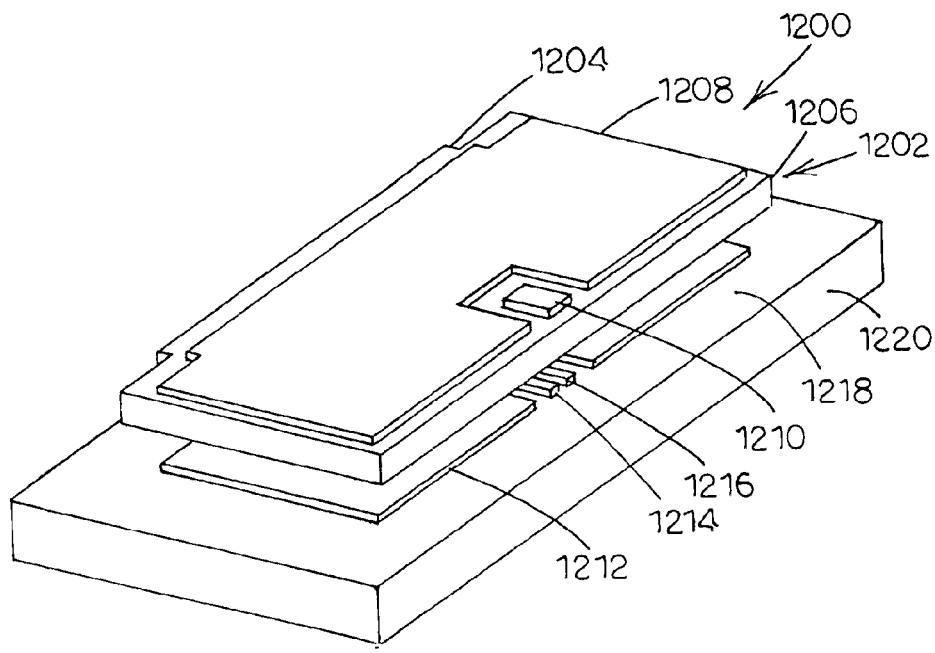
FIG. 12 illustrates a perspective top view of another embodiment of a MEMS switch wherein the electrode interconnect is substantially wider than the contact interconnect and the structural layer is narrow near the anchor.
Figure 13:
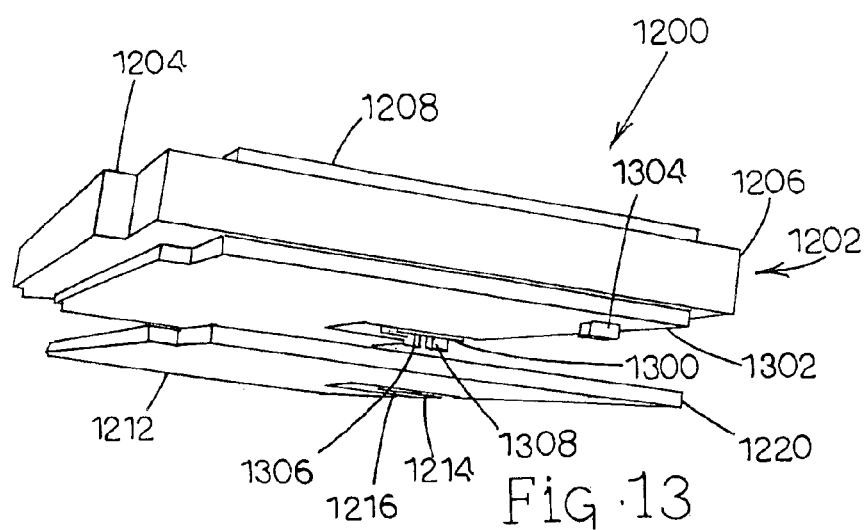
FIG. 13 illustrates a perspective bottom view of a MEMS switch wherein the electrode interconnect is substantially wider than the contact interconnect and the structural layer is narrow near the anchor.

Referring to FIGS. 12 and 13, different views of another MEMS switch, generally designated 1200, in accordance with another embodiment of the present invention are illustrated. Referring specifically to FIG. 12, a perspective top view of MEMS switch 1200 is illustrated. MEMS switch 1200 includes a beam, generally designated 1202, attached at an end 1204 to a mount (not shown). Beam 1202 is attached to the mount via a structural layer 1206. Beam 1202 further includes an electrode interconnect 1208 and a contact interconnect 1210 attached to the top side of structural layer 1206. A movable electrode (shown in FIG. 13) and a movable contact (shown in FIG. 13) are positioned on the under side of structural layer 1206 in alignment with and dimensioned substantially the same as electrode interconnect 1208 and a contact interconnect 1210, respectively. Electrode interconnect 1208 and contact interconnect 1210 are electrically connected to the movable electrode and the movable contact, respectively, through structural layer 1206 by interconnect vias as described above.

MEMS switch 1200 further includes a stationary electrode 1212 and a first and second stationary contact 1214 and 1216 attached to a surface 1218 of a substrate 1220. Stationary electrode 1212 is in alignment with and dimensioned substantially the same as electrode interconnect 1208 and a contact interconnect 1210, respectively. As shown, electrode interconnect 1208 partially surrounds contact interconnect

1210. Structural layer 1206 includes a narrowed anchor zone located at end 1204 for reducing the actuating force required to "close" MEMS switch 1200. The actuating force is reduced because the local cross-sectional area of structural layer 1206 that must be bent in the direction of stationary electrode 1212 is reduced. Contact is improved by applying an overdrive voltage to electrode interconnect 1202 and the stationary electrode.

In this embodiment, the width of structural layer 1206 is decoupled from the width of electrode interconnect 1208 or movable electrode (not shown). When the width of structural layer 1206 and the width of the movable electrode are substantially the same, the actuation voltage will scale independent of the structural layer width. This means that the actuation voltage is constant for any width but the contact force and breaking force will increase. The scalability of this embodiment is limited to increasing contact/breaking force but not to reducing actuation voltage or the ability to overdrive the switch. By decoupling the width of structural layer 1206 from electrode interconnect 1208 and movable electrode (not shown), the scalability of the design increases because the actuation voltage can be minimized, the overdrive capability to achieve high contact forces can be maximized, and the contact force development can be maximized. As the width of structural layer 1206, electrode interconnect 1208, and the movable electrode increase, while the width of fixed end 1204 is held constant, the actuation voltage will decrease, the contact force will increase, the contact resistance will decrease, and the amount of overdrive will increase. The amount of overdrive capability is determined by the difference between the actuation voltage and the maximum voltage applied between the actuation electrodes. The overdrive capability (voltage difference) will increase as the difference between the actuation voltage and the maximum voltage increases.

Referring now to FIG. 13, MEMS switch 1200 further includes a movable contact 1300 and a movable electrode 1302. Movable electrode 1302 includes a first standoff bumper 1304 and a second standoff bumper (not shown) as described above. Movable contact 1300 includes a first and second contact bumper 1306 and 1308 as described above. First standoff bump 1304 and the second standoff bump are configured behind contact bumpers 1306 and 1308 for the reasons stated above.

Figure 14:
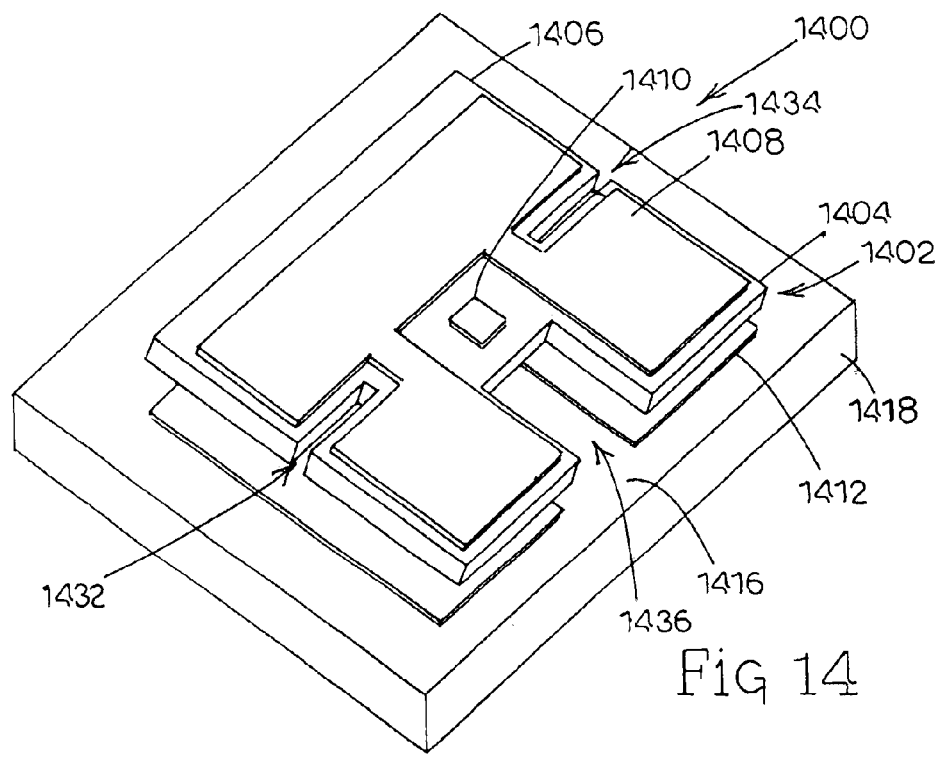
FIG. 14 illustrates a perspective top view of another embodiment of a MEMS switch having compliance cuts.
Figure 15:
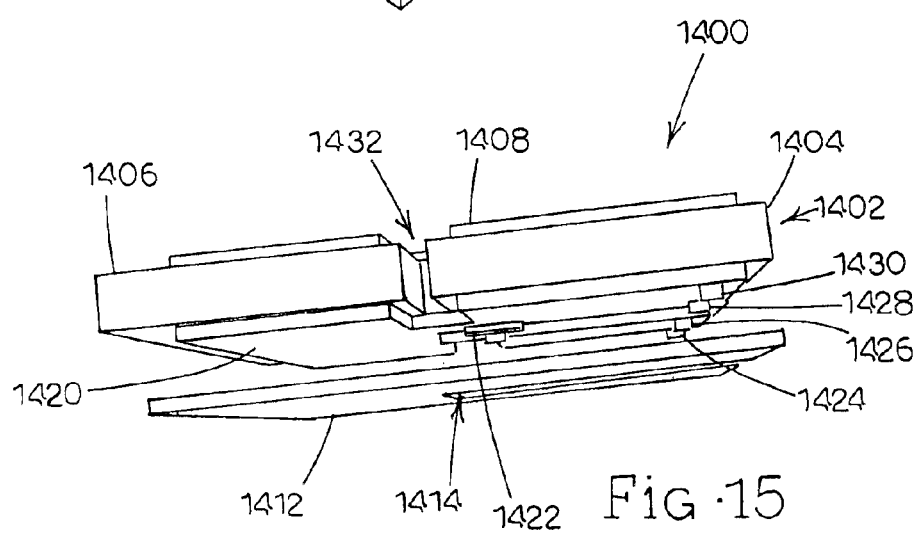
FIG. 15 illustrates a perspective side view of another embodiment of a MEMS switch having compliance cuts.

Referring to FIGS. 14 and 15, different views of another MEMS switch, generally designated 1400, in accordance with another embodiment of the present invention are illustrated. Referring specifically to FIG. 14, a perspective top view of MEMS switch 1400 is illustrated. MEMS switch 1400 includes a beam, generally designated 1402, having a structural layer 1404 attached at one end 1406 to a mount (not shown). Beam 1402 further includes an electrode interconnect 1408 and a contact interconnect 1410 attached to the top side of structural layer 1404. A movable electrode (shown in FIG. 15) and a contact electrode (shown in FIG. 15) are positioned on the under side of structural layer 1404 in alignment with and dimensioned substantially the same as electrode interconnect 1408 and a contact interconnect 1410, respectively. Electrode interconnect 1408 and contact interconnect 1410 are electrically connected to the movable electrode and the movable contact, respectively, through structural layer 1404 by interconnect vias as described above.

MEMS switch 1400 further includes a stationary electrode 1412 and a stationary contact 1414 formed on a surface 1416 (shown in FIG. 14) of a substrate 1418 (shown in FIG. 14). Stationary electrode 1412 and first and second stationary contacts, generally designated 1414, are in alignment with and dimensioned substantially the same as electrode interconnect 1408 and contact interconnect 1410, respectively. As shown, electrode interconnect 1408 partially surrounds contact interconnect 1410.

Beam 1402 further includes a movable electrode 1420 and a movable contact 1422. Movable electrode 1420 includes standoff bumps 1424, 1426, 1428, and 1430 positioned generally at areas of the corners of the surface of movable electrode 1420 that are located furtherest from end 1406. Standoff bumpers 1424, 1426, 1428, and 1430 comprise a non-conductive material. Movable contact 1422 includes contact bumps comprising a conductive material. In this embodiment, standoff bumps 1424, 1426, 1428, and 1430 are distal to contact bump 1422. Standoff bumps 1424, 1426, 1428, and 1430 are intended to establish contact before contact bump 1422 establishes contact. Once standoff bumps 1424, 1426, 1428, and 1430 establish contact, the actuation voltage is increased to cause further deformation of beam 1402, which includes pivoting on standoff bumps 1424, 1426, 1428, and 1430. The voltage is increased until the contact bumps establishes contact with stationary contact 1414.

Referring again to FIG. 14, beam 1402 further includes compliance cuts 1432, 1434, and 1436 to increase the compliancy of beam 1402. As the actuation voltage is increased to establish contact between the contact bumps of movable contact 1422 and stationary contact 1414, compliance cuts 1432, 1434, and 1436 increase the deformability of beam 1402. Movable contact 1422 is positioned near or centered on compliance cuts in order to increase the flexibility local to where contact is to be established. This embodiment can improve the actuation voltage to parasitic actuation ratio by extending the actuation electrode far beyond the movable contact. The basic principle is to move the center of electrostatic pressure of the actuation electrodes more distal of the electrostatic pressure of the movable contact. This lowers the actuation voltage while increasing the parasitic actuation voltage. Furthermore, this embodiment aides the breaking of the contact because of the pivoting about the standoff bumps.

Figure 16:
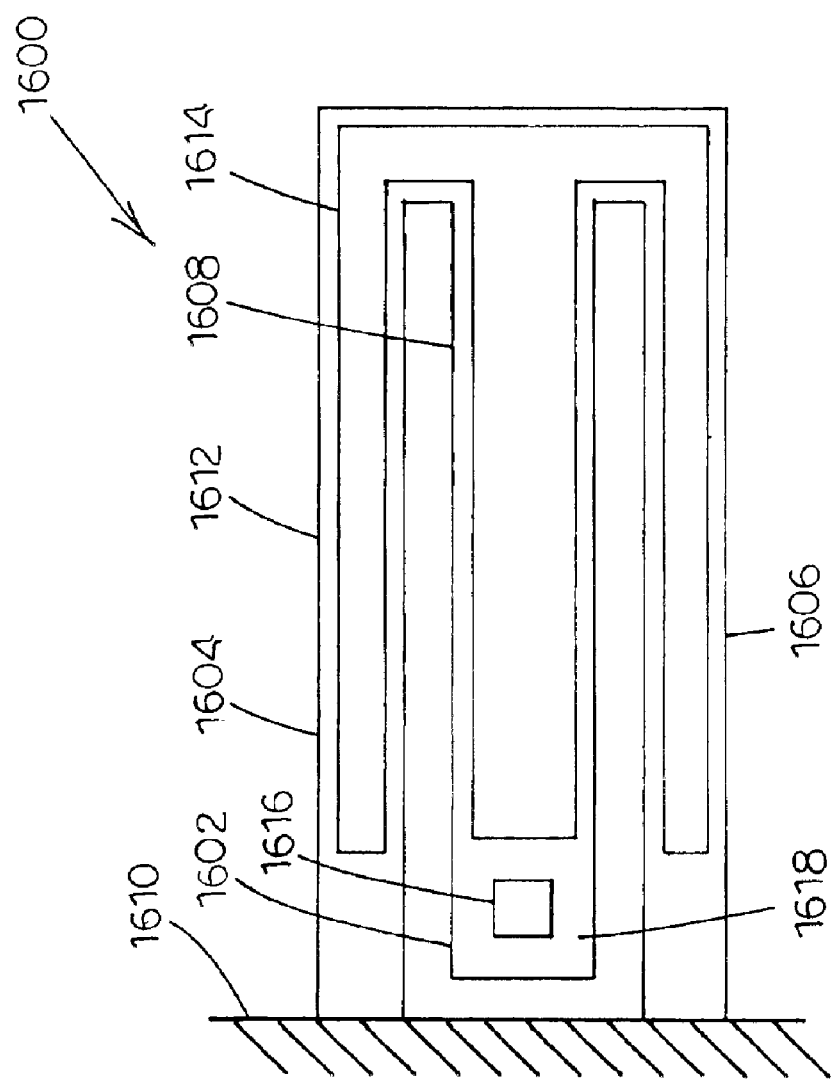
FIG. 16 illustrates a top view of another embodiment of a MEMS switch having a folded beam geometry.

Referring to FIG. 16, a top view of a MEMS switch, generally designated 1600, having a folded beam geometry in accordance with another embodiment of the present invention is illustrated. MEMS switch 1600 includes an arm 1602 attached to two folded beams 1604 and 1606. Folded beams 1604 and 1606 are attached at an end 1608 of cantilever 1602. Folded beams 1604 and 1606 function to attach cantilever 1602 to a mount 1610 and suspend arm 1602 over a substrate (not shown). Cantilever arm 1602 is suspended by folded beams 1604 and 1606 such that contact interconnect is near mount 1610. This folding of arm 1602 produces a beam with a long effective length to lower the actuation voltage. The contact interconnect is near the mount to produce a short distance to the center of electrostatic pressure of the parasitic actuation with the effect of increasing the electrostatic pressure. Arm 1602 and folded beams 1604 and 1606 are interconnected by a structural layer 1612 that provides a resilient structure for arm 1602 and folded beams 1604 and 1606. Arm 1602 and folded beams 1604 and 1606 include an electrode interconnect 1614 extending substantially over the top surface of structural layer 1612. Arm 1602 further includes a contact interconnect 1616 attached at an end 1618 distal from end 1608. A movable electrode (not shown) and a contact electrode (not shown) are positioned on the under side of structural layer 1612 in alignment with and dimensioned substantially the same as electrode interconnect 1614 and contact interconnect 1616, respectively. Electrode interconnect 1614 and contact interconnect 1616 are electrically connected to the movable electrode and the movable contact, respectively, through structural layer 1612 by interconnect vias as described above. The principle advantage of this embodiment is to provide a high parasitic actuation and a low actuation voltage. This is accomplished by the suspension of cantilever arm 1602 from folded beams 1604 and 1606 and by placement of the contact near mount 1610. By application of the actuation voltage between the stationary electrode and the movable electrode (not shown), folded beams 1604 and 1606 are pulled toward the substrate (not shown). As folded beams 1604 and 1606 are pulled toward the substrate, cantilever arm 1602 will either deform towards or away from the substrate depending on the design. The behavior results in a virtual pivot point, which determined whether cantilever arm 1602 deforms towards or away from the substrate. The location of the virtual pivot point will be determined by the relative length of cantilever arm 1602; the geometry and layout of the stationary electrode on the substrate; and the stiffness of cantilever arm 1602 relative to the stiffness of folded beams 1604 and 1606. For example, the stationary electrode can be limited in extent to the area directly under cantilever arm 1602 and the area where the distal end 1608 connects to folded beams 1604 and 1606. The virtual pivot point is positioned to realize a low actuation voltage and a high parasitic voltage.

Figure 17:
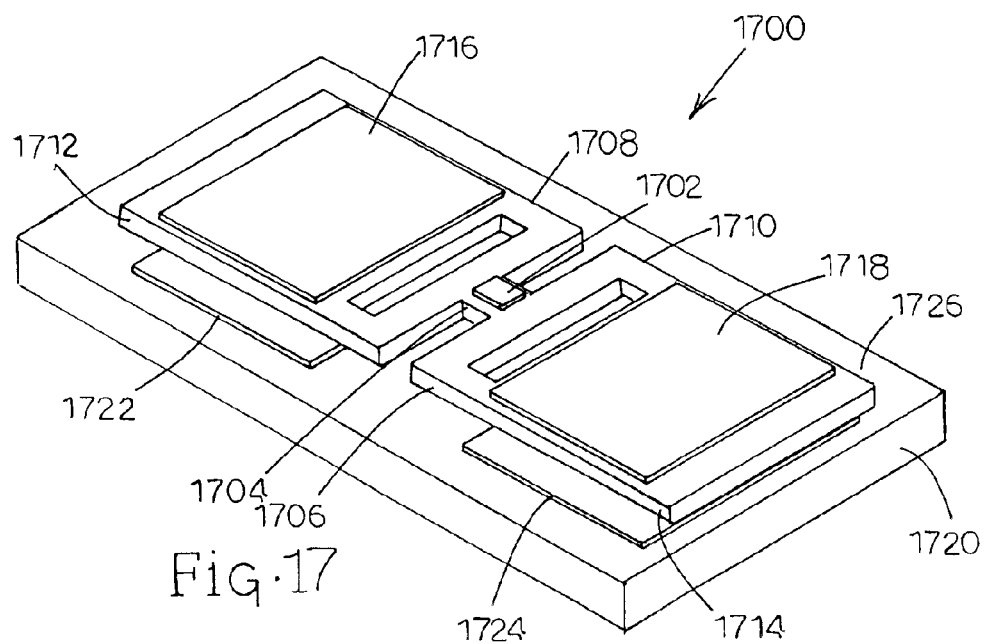
FIG. 17 illustrates a perspective top view of another embodiment of a MEMS switch having two cantilever beams.
Figure 18:
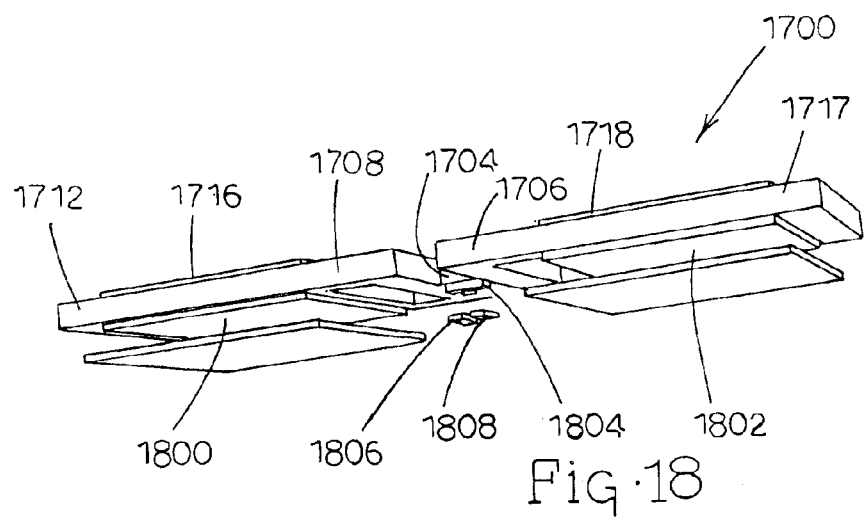
FIG. 18 illustrates a perspective bottom view of another embodiment of a MEMS switch having two cantilever beams.

Referring to FIGS. 17 and 18, different views of a MEMS switch, generally designated 1700, having dual actuation electrodes in accordance with another embodiment of the present invention are illustrated. Referring specifically to FIG. 17, a perspective top view of MEMS switch 1700 is illustrated. MEMS switch 1700 includes a contact interconnect 1702 the top side of a center portion 1704 of a structural layer 1706. Center portion 1704 of structural layer 1706 is attached to a first flexure 1708 and a second flexure 1710. A first portion 1712 and a second portion 1714 of structural layer 1706 are connected to first flexure 1708 and second flexure 1710, respectively. First portion 1712 and second portion 1714 are connected to mounts (not shown).

MEMS switch 1700 further includes a first electrode interconnect 1716 and a second electrode interconnect 1718 attached to the top side of first portion 1712 and second portion 1714. A first movable electrode (shown in FIG. 18), a second movable electrode (shown in FIG. 18), and a movable contact (shown in FIG. 18) are positioned on the underside of structural layer 1704 in alignment with and dimensioned substantially the same as first electrode interconnect 1716, second electrode interconnect 1718, and contact interconnect 1702, respectively. First electrode interconnect 1716, second electrode interconnect 1718, and contact interconnect 1702 are electrically connected to the first movable electrode, the second movable electrode, and the movable contact, respectively, through structural layer 1706 by interconnect vias as described above.

MEMS switch 1700 further includes a substrate 1720 having a first stationary electrode 1722, a second stationary electrode 1724, and a stationary contact (shown in FIG. 18) attached on a surface 1726 thereof. First stationary electrode 1722, a second stationary electrode 1724, and the stationary contact positioned in alignment with and dimensioned substantially the same as the first movable electrode, the second movable electrode, and the contact electrode.

Referring now to FIG. 18, a perspective view of the underside of structural layer 1706 of MEMS switch 1700 is illustrated. As discussed above, a first movable electrode 1800, a second movable electrode 1802, and a movable contact 1804 are attached to the underside of structural layer 1706. Substrate 1720 is not shown in FIG. 18 to illustrate positioning of first stationary electrode 1722, second stationary electrode 1724, a first stationary contact 1806, and a second stationary contact 1808 with respect to first movable electrode 1800, second movable electrode 1802, a first movable contact 1804, and a second movable contact 1806. Movable contact 1804 includes a contact bump 1808 comprising a conductive material as described above. This embodiment has the advantage of an improved ratio of the actuation voltage to the parasitic actuation voltage. Two simple cantilever beam switches are included as described above. The movable contact and contact interconnect are suspended between two structures 1712 and 1714 by flexures 1708 and 1710. Flexures 1708 and 1710 isolate the contact from residual film stresses in the materials comprising switch 1700.

During operation, the actuation is applied between stationary electrodes 1722 and 1724 and movable electrode 1800 and 1802, respectively. The actuation voltage produces a deflection in cantilevered portions 1712 and 1714 of structure 1706. The actuation voltage is of such a magnitude to cause movable contact 1804 to establish contact with the stationary contact. In principle, two structures 1712 and 1714 are being driven to establish contact but the actuation voltage remains the same as actuating a single structure. The advantage is realized because the parasitic voltage must overcome the two elements, which significantly improves the actuation voltage to parasitic voltage ratio. Flexures 1708 and 1710 are compliant in the direction indicated from the end of structure 1712 to the end of structure 1714. Flexures 1708 and 1710 have limited compliance in the direction perpendicular to the substrate because this would impact the parasitic actuation negatively.

Figure 19:
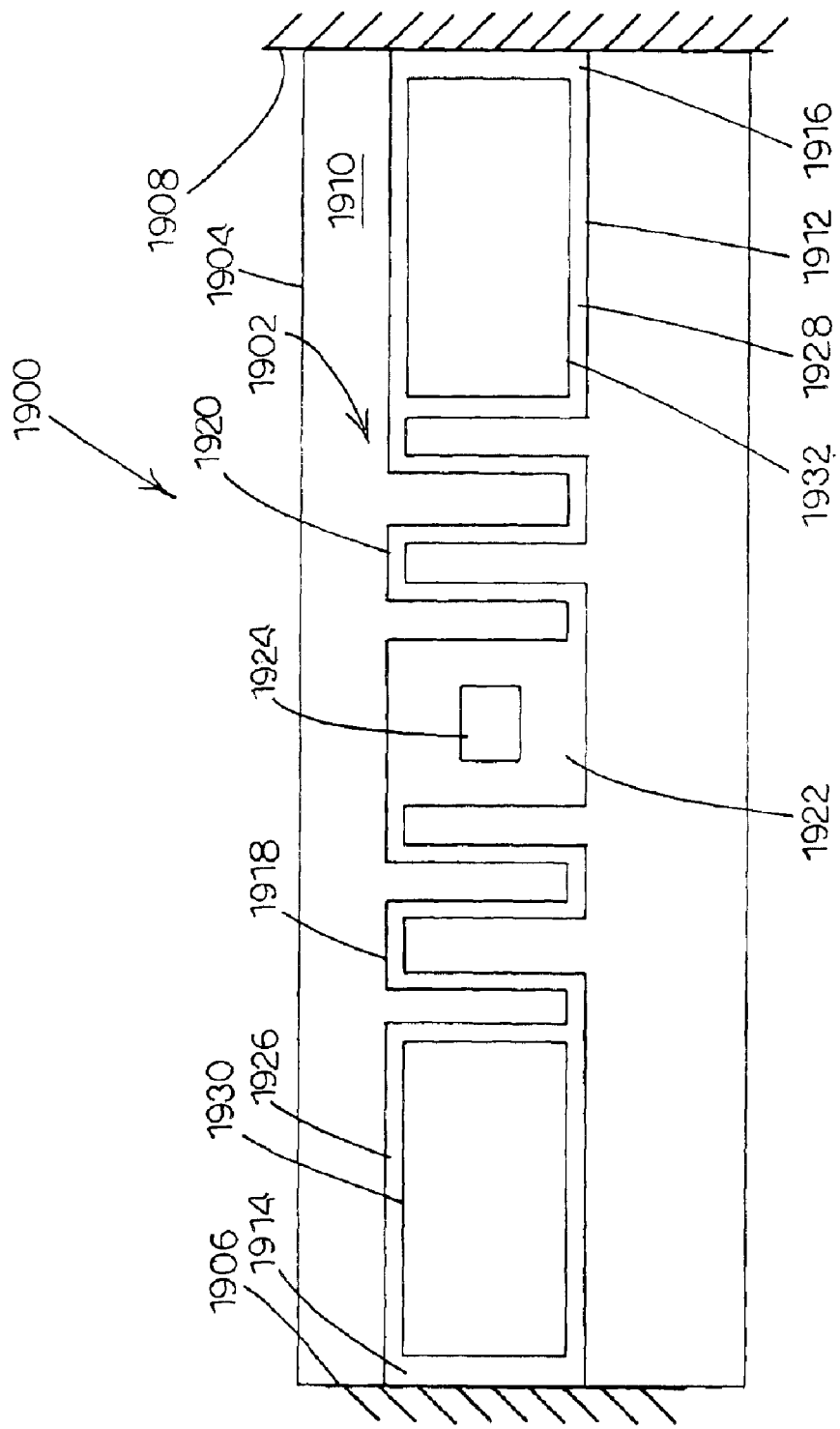
FIG. 19 illustrates a top view of another embodiment of a MEMS switch having two cantilever beams.

Referring to FIG. 19, a view of another MEMS switch, generally designated 1900, in accordance with another embodiment of the present invention is illustrated. MEMS switch 1900 includes a suspension 1902 attached to a substrate 1904 by a first mount 1906 and a second mount 1908. Suspension 1902 suspends a movable contact (not shown) over a surface 1910 of substrate 1904. Folded beam suspension 1902 includes a structural layer 1912 extending from a first end 1914 to a second end 1916. First end 1914 and second end 1916 are connected to first mount 1906 and second mount 1908, respectively. Structural layer 1912 forms a first folded suspension 1918 and a second folded suspension 1920 attached to a first portion 1922 of structural layer 1912.

Suspension 1902 further includes a contact interconnect 1924 attached to the top side of a first portion 1922. Suspension 1902 includes a second portion 1926 attached between first end 1914 and first folded suspension 1918. Suspension 1902 further includes a third portion 1928 attached between second end 1916 and second folded suspension 1920. A first electrode interconnect 1930 and a second electrode interconnect 1932 are attached to the top side surfaces of second portion 1926 and third portion 1928, respectively. A first movable electrode (not shown), a second movable electrode (not shown), and a movable contact (not shown) are positioned on the under side of second portion 1926, third portion 1928, and first portion 1922, respectively, of structural layer 1912 in alignment with and dimensioned substantially the same as first electrode interconnect 1930, second electrode interconnect 1932, and contact interconnect 1924, respectively. First electrode interconnect 1930, second electrode interconnect 1932, and contact interconnect 1924 are electrically connected to the first movable electrode, the second movable electrode, and the movable contact, respectively, through structural layer 1912 by interconnect vias as described above. This embodiment includes two cantilever beam switches as described above. The movable contact and contact interconnect are suspended between the two cantilever beam structures as indicated by portions 1926 and 1928 by flexures 1918 and 1920. Flexures 1918 and 1920 isolate the contact from residual film stresses in the materials comprising switch 1900. During operation, the actuation voltage is applied between the stationary electrodes (not shown and the movable electrodes (not shown). The actuation voltage produces a deflection in portions 1926 and 1928 of structure 1902. The actuation voltage is of such a magnitude to cause the movable electrode to establish contact with the stationary contact. In principle, actuated portions 1926 and 1928 are being driven to establish contact but the actuation voltage remains the same as actuating a single portion 1926 or portion 1928. The parasitic actuation voltage must overcome the two elements, which significantly improves the actuation voltage to parasitic voltage ratio. Flexures 1918 and 1920 are designed to be compliant in the direction indicated from first end 1914 to second end 1916. Flexures 1918 and 1920 have limited compliance in the direction perpendicular to the substrate because this would negatively impact the parasitic actuation.

Figure 20:
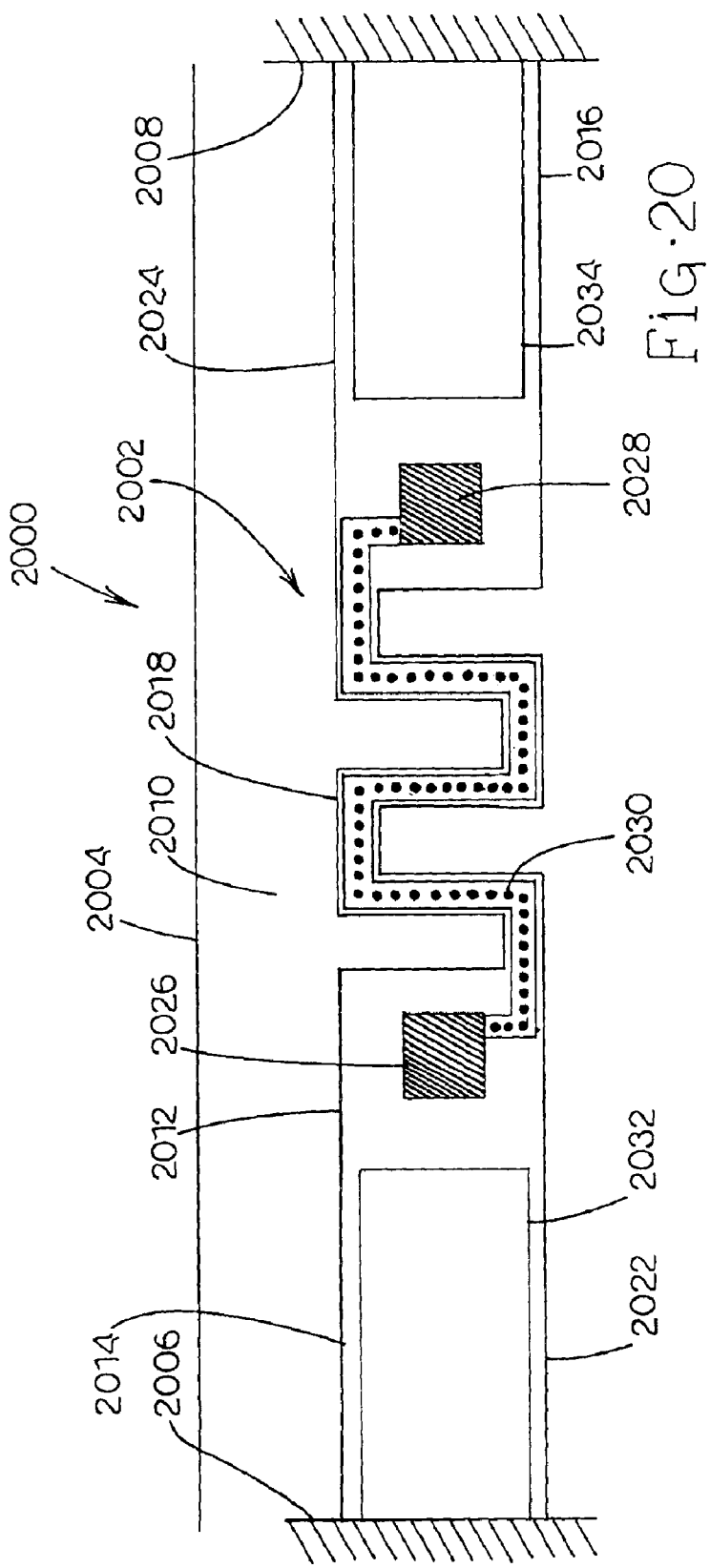
FIG. 20 illustrates a top view of another embodiment of a MEMS switch having two cantilever beams.

Referring to FIG. 20, a view of another MEMS switch, generally designated 2000, in accordance with another embodiment of the present invention is illustrated. MEMS switch 2000 includes a suspension 2002 attached to a substrate 2004 by a first mount 2006 and a second mount 2008. Suspension 2002 suspends a pair of movable contacts (not shown) over a surface 2010 of substrate 2004. Folded beam suspension 2002 includes a structural layer 2012 extending from a first end 2014 to a second end 2016. First end 2014 and second end 2016 are connected to first mount 2006 and second mount 2008, respectively.

Suspension 2002 includes a first portion 2024 attached between first end 2014 and folded suspension 2018. Suspension 2002 further includes a second portion 2024 attached between second end 2016 and folded suspension 2018. Suspension 2002 includes a first contact interconnect 2026 attached to the top side of first portion 2022. Suspension 2002 includes a second contact interconnect 2028 attached to the top side of second portion 2024. Suspension 2002 includes a third contact interconnect attached to the top side of flexure 2018 and connecting first and second contact interconnects 2026 and 2028. A first electrode interconnect 2032 and a second electrode interconnect 2034 are attached to the top side surfaces of first portion 2022 and second portion 2024, respectively. A first movable electrode (not shown), a second movable electrode (not shown), and movable contacts (not shown) are positioned on the underside of first portion 2022, second portion 2024, and flexure 2018, respectively, of structural layer 2012 in alignment with and dimensioned substantially the same as first electrode interconnect 2032, second electrode interconnect 2034, and contact interconnects 2026, 2028, and 2030, respectively. First electrode interconnect 2032, second electrode interconnect 2034, and contact interconnects 2026, 2028, and 2030 are electrically connected to the first movable electrode, the second movable electrode, and the movable contacts, respectively, through structural layer 2012 by interconnect vias (not shown) as described above.

This embodiment comprises two cantilever beam switches as described in other embodiments above. The movable contacts and contact interconnects 2026 and 2028 are suspended by the two cantilever beam structures as indicated by portions 2022 and 2024 by flexure 2018. Flexure 2018 isolates portions 2022 and 2024 from residual film stresses in the materials comprising switch 2000. During operation, the actuation voltage is applied between the stationary electrodes and the movable electrodes. The actuation voltage produces a deflection in the two, cantilevered portions 2022 and 2024 of structure 2002. The actuation voltage is of such a magnitude to cause contact bumps (not shown) on the movable contacts to establish contact with the stationary contacts. When contact is established, the contact bump of the first movable contact communicates electrically with the second movable contact through its contact bump to the second stationary contact on substrate 2004. The electrical communication is conducted through contact interconnects 2026, 2028, and 2030. In principle, two actuated portions 2022 and 2024 are being driven to establish a contact but the actuation voltage remains the same as actuating a single portion. The parasitic voltage must overcome the two portions 2022 and 2024, which significantly improves the actuation voltage to parasitic actuation voltage ratio. Flexure 2018 is designed to be compliant in the direction indicated from end 2014 to end 2016. Flexure 2018 has limited compliance in the direction perpendicular to substrate 2004 because this would impact the parasitic actuation negatively.

Figure 21:
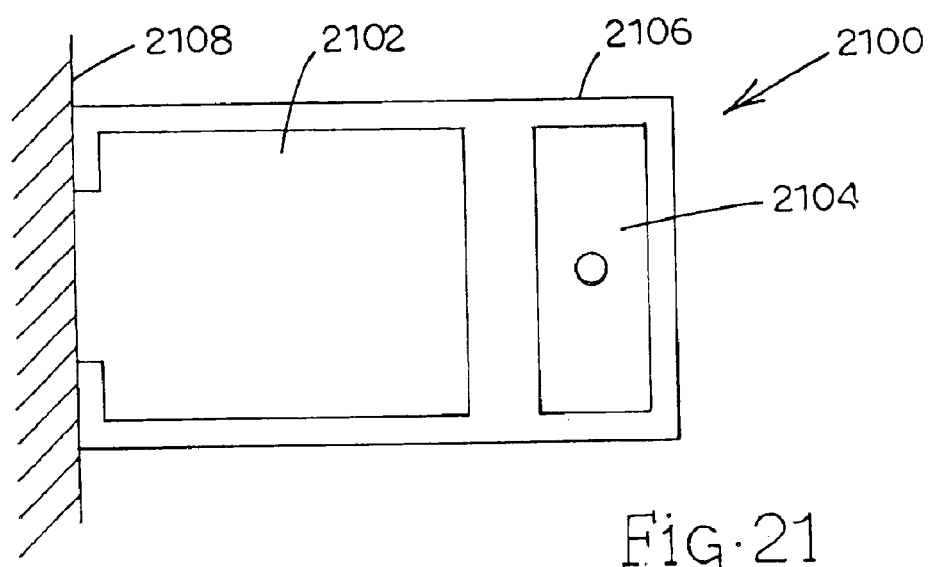
FIG. 21 illustrates a top view of another embodiment of a MEMS switch having contact routes on the bottom side of the structural layer.
Figure 22:
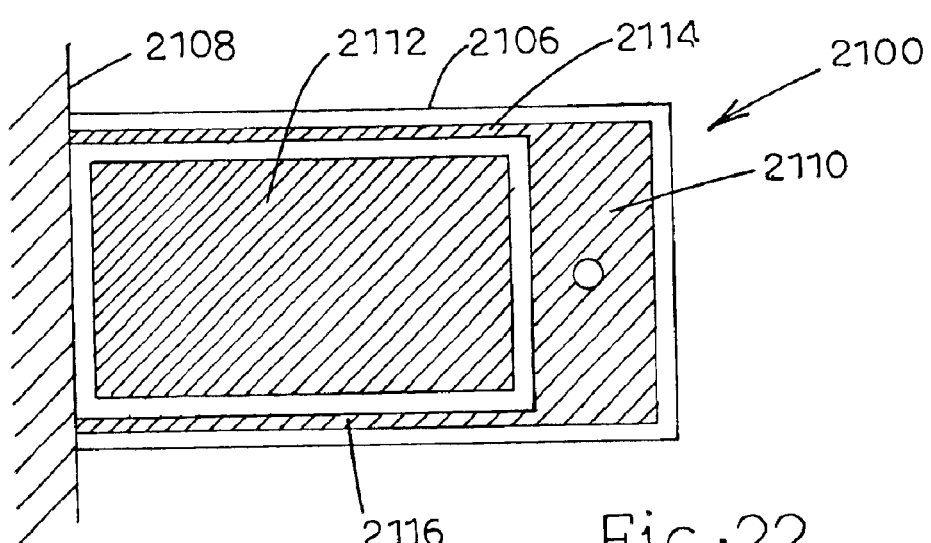
FIG. 22 illustrates a bottom view of another embodiment of a MEMS switch having contact routes on the bottom side of the structural layer.

Referring to FIGS. 21 and 22, different views of another embodiment of a MEMS switch, generally designed 2100, in accordance with another embodiment of the present invention are illustrated. Referring specifically to FIG. 21, a top view is provided of the beam of MEMS switch 2100 including an electrode interconnect 2102 and a contact interconnect 2104. Electrode interconnect 2102 and contact interconnect 2104 are attached to the top surface of structural layer 2106. Structural layer 2106 is connected at one end to a mount 2108.

Referring now to FIG. 22, a view of the underside of beam of MEMS switch 2100 is provided. MEMS switch 2100 includes a movable contact 2110, a movable electrode 2112, and first and second contact routes 2114 and 2116 attached to the underside of the beam of MEMS switch 2100. MEMS switch 2100 includes a single stationary contact (not shown) for contacting movable contact 2110 when MEMS switch 2100 is in a "closed" position. First and second contact routes 2114 and 2116 comprise a conductive material and connected to movable contact 2110. First and second contact routes 2114 and 2116 extend through anchor 1208 and can be electrically connected to a suitable electrical device (not shown) for providing electrical communication between the electrical device and the stationary contact when MEMS switch 2100 is in a closed position.

Figure 23:
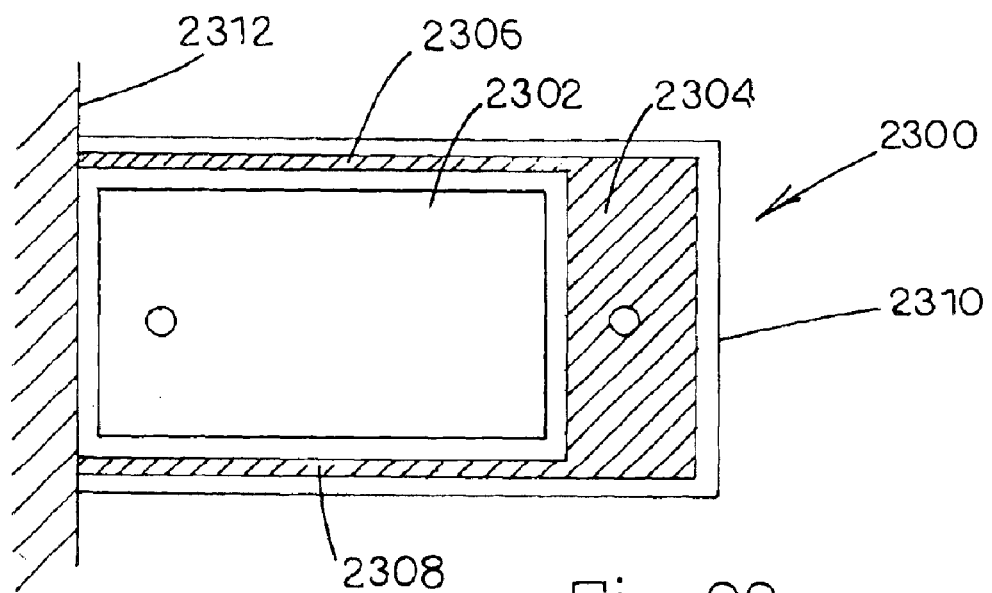
FIG. 23 illustrates a top view of another embodiment of a MEMS switch having contact routes on the bottom and top side of the structural layer.
Figure 24:
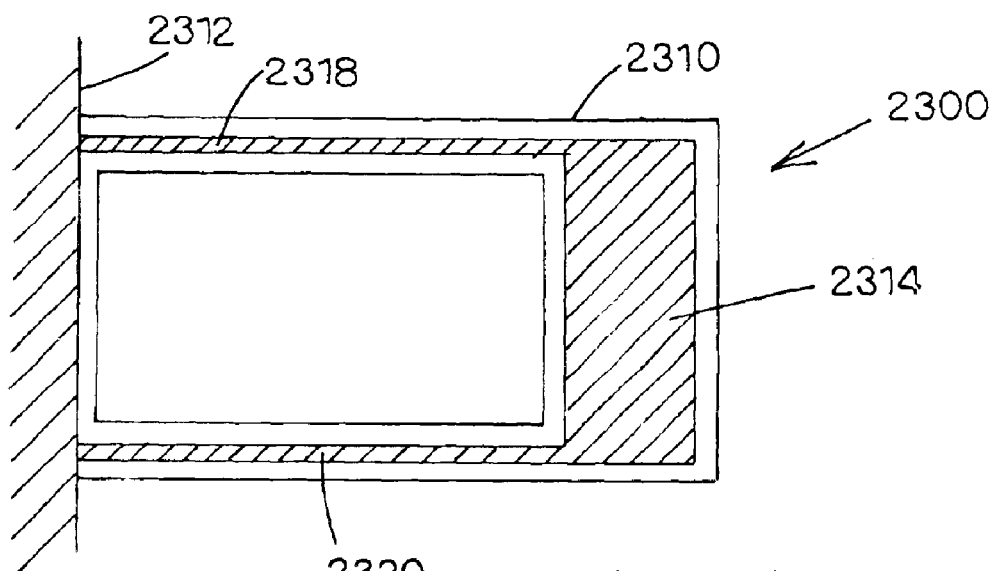
FIG. 24 illustrates a bottom view of another embodiment of a MEMS switch having contact routes on the bottom and top side of the structural layer.

Referring to FIGS. 23 and 24, different views of another embodiment of a MEMS switch, generally designed 2300, in accordance with another embodiment of the present invention are illustrated. Referring specifically to FIG. 23, a top view is provided of the beam of MEMS switch 2300 including an electrode interconnect 2302, a contact interconnect 2304, and first and second contact routes 2306 and 2308. Components 2302, 2304, 2306, and 2308 are attached to the top surface of structural layer 2310. Structural layer 2310 is connected at one end to a mount 2312. MEMS switch 2300 includes a single stationary contact (not shown) for contacting a movable contact 2314 (shown in FIG. 24) when MEMS switch 2300 is in a "closed" position. First and second contact routes 2306 and 2308 comprise a conductive material and connected to contact interconnect 2304. First and second contact routes 2306 and 2308 extend through anchor 2312 and can be electrically connected to a suitable electrical device (not shown) for providing electrical communication between the electrical device and the stationary contact when MEMS switch 2300 is in a "closed" position.

Referring now to FIG. 24, a view of the underside of beam of MEMS switch 2300 is provided. MEMS switch 2300 further includes a movable electrode 2316 and third and fourth contact routes 2318 and 2320 attached to the underside of the beam of MEMS switch 2300. Third and fourth contact routes 2318 and 2320 comprise a conductive material and connected to movable contact 2314. First and second contact routes 2114 and 2116 extend through anchor 1208 and can be electrically connected to the electrical device (not shown) for providing electrical communication between the electrical device and the stationary contact when MEMS switch 2300 is in a closed position. Contact interconnect 2304 is connected to movable contact 2314 by vias (not shown) through the structural layer 2310 as described above. Electrical communication between stationary contact and electrical devices (not shown) is conducted through contact routes 2306, 2308, 2318, and 2320. The multiple paths for carrying current will increase the current carrying capacity across the switch while maintaining actuation performance and isolation performance. Electrode interconnect 2302, contact interconnect 2304, and first and second contact routes 2306 and 2308 are geometrically, thermally, and mechanically matches to the movable electrode 2316, the movable contact 2314, and contact routes 2318 and 2320, respectively.

Figure 25:
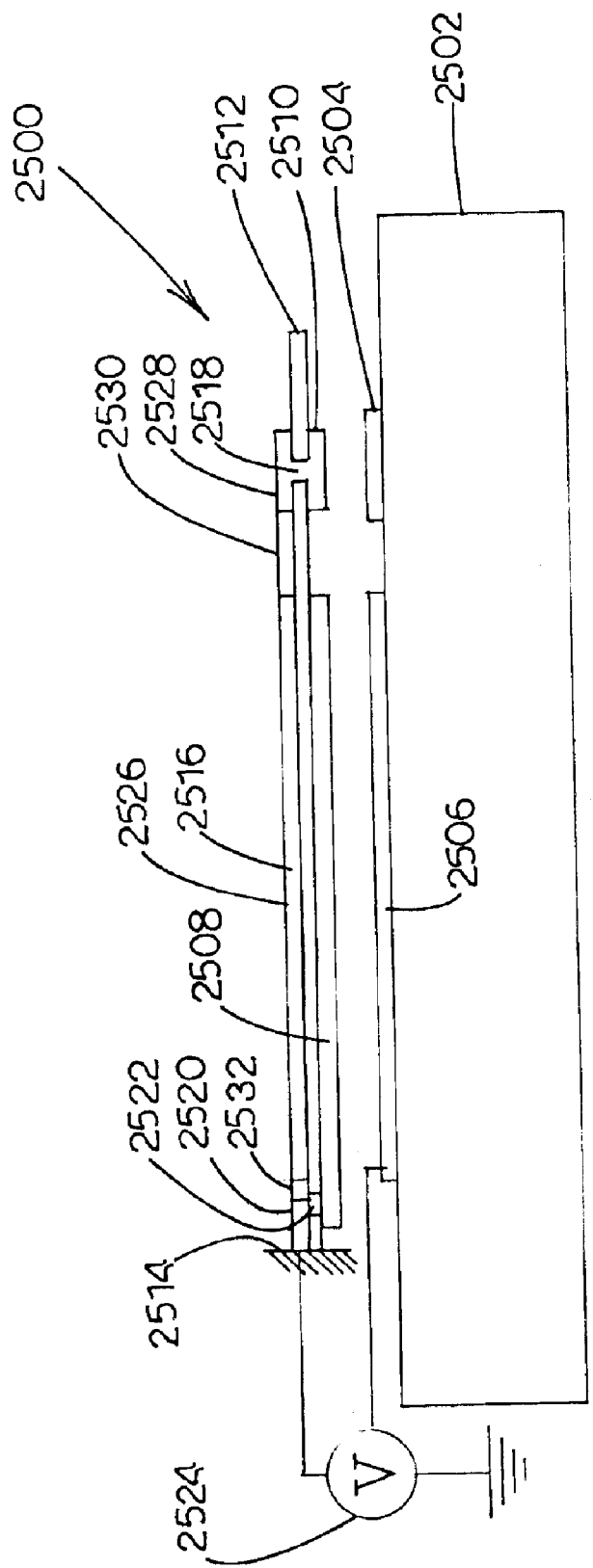
FIG. 25 illustrates a cross-sectional side view of a MEMS switch having a contact interconnect dimensioned substantially equal to and aligned with the movable contact and movable electrode.

Referring to FIGS. 25–27, different views of a MEMS switch, generally designated 2500, having a trilayered beam are illustrated in accordance with another embodiment of the present invention. Referring specifically to FIG. 25, a cross-sectional side view of MEMS switch 2500 is illustrated in an "open" position. MEMS switch 2500 includes a substrate 2502. Substrate 2502 includes a single stationary contact 2504 and a stationary electrode 2506 formed on a surface thereof. MEMS switch 2500 further includes a movable electrode 2508 and a movable contact 2510 attached to the underside of a structural layer 2512. Structural layer 2512 is fixed at one end to an anchor 2514.

MEMS switch 2500 further includes a contact interconnect 2516 extending substantially the length of the structural layer 2512. Contact interconnect 2516 extends past anchor 2514 for electrical connection to an electrical device suitable for interaction with MEMS switch 2500. Contact interconnect 2516 is connected to movable contact 2510 through structural layer 2512 by a first interconnect via 2518. When MEMS switch 2500 is in a "closed" position, electrical communication is provided between the electrical device and stationary contact 2504 through movable electrode 2510, first interconnect via 2518, and contact interconnect 2516.

MEMS switch 2500 further includes a first electrode interconnect 2520 and a second electrode interconnect (not shown) attached to the top side of structural layer 2512 and positioned adjacent contact interconnect 2516. First electrode interconnect 2520 and the second electrode interconnect are connected to movable electrode 2508 through a second interconnect via 2522 and a third interconnect via (not shown). First electrode interconnect 2520 and the second electrode interconnect extend beyond anchor 2514 for connection to a voltage source 2524.

Contact interconnect 2516 includes an electrode portion 2526 and a contact portion 2528 shaped to substantially match the shape and dimensions of movable electrode 2508 (shown in FIG. 27) and movable contact 2510, respectively, aligned on the bottom side of structural layer 2512. Contact interconnect 2516 includes a first and second connect route 2530 and 2532 for connecting electrode portion 2526 and a contact portion 2528 to each other and to the electrical device.

Referring now to FIG. 26, a top perspective view of MEMS switch 2500 is illustrated. As shown, second electrode interconnect 2600 is positioned is positioned on the other side of second connect route 2530 from first electrode interconnect 2520. Furthermore, electrode portion 2526 and contact portion 2528 are shown having a shape and dimension the same as movable electrode 2508 and movable contact 2510, respectively (shown in FIGS. 25 and 27). MEMS switch 2500 maximizes the material in the electrical communication path by using most of the area on the topside of structural layer 2512 for current carrying capacity. A small amount of the available topside area is used for electrode interconnection to the movable electrode 2508. The electrical communication is established from stationary contact 2504 to movable contact 2510, through a via through structural layer 2512, to contact portion 2528, through first connect route 2530, through electrode portion 2526, and through a second connect route to an electrical device (not shown). The increased cross-sectional area of this pathway decreases the resistance and increases the current carrying capacity of this embodiment. First and second connect route 2530 and 2532 are dimensioned smaller than electrode portion 2526 and contact portion 2528 to limit the mismatch of materials on the topside and bottomside of structural layer 2512. This dimensioning is performed in a manner to not limit the resistance or the current capacity. The reduced cross-sectional area of first contact route 2530 relative to the cross-sectional area of contact portion 2528 invokes localized self-heating that can contribute to contact force. Electrical isolation between communication paths (2504, 2510, 2528, 2530, 2526, and 2532) and movable electrode 2508 is maintained by the thickness of structural layer 2512.

This switch design can be fabricated in an appropriate process to enable the production of a single switch as shown in FIGS. 1–24 or the production of switch arrays, which have various arrangements.

It will be understood that various details of the invention may be changed without departing from the scope of the invention. The switch embodiments described above can be applied to cantilever beams, doubly supported beams, plates or other known type switch geometries known to those of skill in the art. Furthermore, the foregoing description is for the purpose of illustration only, and not for the purpose of limitation—the invention being defined by the claims.

What is claimed is:

1. A microscale, electrostatically actuated switch having a movable, trilayered microcomponent, the switch comprising:

(a) a substrate including a stationary electrode and a stationary contact attached thereto;

(b) a resilient structural layer including at least one end fixed with respect to the substrate, a bottom surface suspended over the substrate, and a top surface opposing the bottom surface;

(c) a movable electrode attached to the bottom surface of the resilient structural layer whereby the movable electrode is separated from the stationary electrode by a first gap;

(e) an electrode interconnect attached to the top surface of the resilient structural layer and connected to the movable electrode for electrical communication;

(f) a movable contact attached to the bottom surface of the resilient structural layer whereby the movable contact is separated from the stationary contact by a second gap and wherein the movable contact is positioned adjacent the at least one end and the movable electrode substantially covers an area of the bottom surface surrounding the movable contact; and (g) a contact interconnect formed on the top surface of the resilient structural layer and connected to the movable contact for electrical communication.

2. The switch of claim 1 wherein the movable electrode and the electrode interconnect have substantially equal respective coefficients of thermal expansion.

3. The switch of claim 1 wherein the movable contact and the contact interconnect have substantially equal respective coefficients of thermal expansion.

4. The switch of claim 1 wherein the stationary electrode comprises a metal material.

5. The switch of claim 1 wherein the movable electrode substantially covers the bottom surface of be resilient structural layer.

6. The switch of claim 1 wherein the electrode interconnect substantially covers the top surface of the resilient structural layer.

7. The switch of claim 1 wherein the movable electrode and electrode interconnect are dimensioned substantially equal to and aligned with one another on opposing surfaces of the resilient structural layer.

8. The switch of claim 1 wherein the movable contact and contact interconnect are dimensioned substantially equal to and aligned with one another on opposing surface of the resilient structural layer.

9. The switch of claim 1 wherein the resilient structural layer has a second end freely suspended with respect to the substrate.

10. The switch of claim 1 wherein the movable electrode comprises a metal material.

11. The switch of claim 1 wherein the electrode interconnect extends substantially an area of a second surface of the resilient structural layer.

12. The switch of claim 1 wherein the resilient structural layer comprises a nonconductive material.

13. The switch of claim 1 wherein the resilient structural layer further includes a narrowed portion connecting the electrode interconnect and movable electrode with the contact interconnect and movable contact.

14. The switch of claim 1 wherein the contact interconnect further includes a contact route extending to the at least one end for connecting to an electrical device.

15. The switch of claim 1 wherein the contact interconnect further includes a first and second contact route extending to the at least one end for connecting to an electrical device, whereby the contact routes extend on opposing sides of the electrode interconnect.

16. The switch of claim 1 wherein the movable contact further includes a contact route extending to the at least to an electrical device.

17. The switch of claim 16 wherein the contact interconnect further includes a contact extending to the at least one end for connecting to the electrical device.

18. A microscale, electrostatically actuated switch having a movable, trilayered microcomponent, the switch comprising:

(a) a substrate including a stationary electrode and a stationary contact attached thereto;

(b) a resilient structural layer including at least one end fixed with respect to the substrate, a bottom surface suspended over the substrate, and a top surface opposing the bottom surface;

(c) a movable electrode attached to the bottom surface of the resilient structural layer whereby the movable electrode is separated from the stationary electrode by a gap;

(d) a movable contact attached to the bottom surface of the resilient structural layer whereby the movable contact is separated from the stationary contact by a gap; and (e) a contact interconnect formed on the top surface of the resilient structural layer, connected to the movable contact for electrical communication, and dimensioned substantially equal to and aligned with the movable contact and movable electrode.

19. The switch of claim 18 wherein the movable contact and the contact interconnect have substantially equal respective coefficients of thermal expansion.

20. The switch of claim 18 wherein the contact interconnect includes an electrode portion that is dimensioned substantially equal to and aligned with the movable electrode.

21. The switch of claim 18 wherein the contact interconnect includes a contact portion that is dimensioned substantially equal to and aligned with the movable contact.

22. The switch of claim 21 wherein the contact interconnect further includes an electrode portion that is dimensioned substantially equal to and aligned with the movable electrode and a connect route for electrically connecting the electrode portion and the contact portion.

\* \* \* \* \*